(12) United States Patent
Yang et al.

(10) Patent No.: US 11,171,152 B2
(45) Date of Patent: Nov. 9, 2021

(54) THREE-DIMENSIONAL FLASH MEMORY DEVICE INCLUDING CELL GATE PATTERNS HAVING BLOCKING BARRIER PATTERNS AND A METHOD FOR MANUFACTURING THE SAME

(71) Applicant: Samsung Electronics Co., Ltd., Suwon-si (KR)

(72) Inventors: Chunghwan Yang, Suwon-si (KR); Joyoung Park, Suwon-si (KR); Taeyun Bae, Suwon-si (KR); Byungyong Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 16/588,067

(22) Filed: Sep. 30, 2019

(65) Prior Publication Data

US 2020/0402994 A1 Dec. 24, 2020

(30) Foreign Application Priority Data

Jun. 18, 2019 (KR) .................. 10-2019-0072284

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ................. H01L 27/11582; H01L 27/1157
See application file for complete search history.

(56) References Cited

U.S. PATENT DOCUMENTS 9,831,265 B2 11/2017 Kim et al.
2012/0295409 A1 11/2012 Yun et al.
(Continued)

FOREIGN PATENT DOCUMENTS

KR 20150070746 A 6/2015
KR 20180007602 A 1/2018
(Continued)

*Primary Examiner* — Fernando L Toledo
*Assistant Examiner* — Neil R Prasad
(74) *Attorney, Agent, or Firm* — Harness, Dickey & Pierce, P.L.C

(57) ABSTRACT

A three-dimensional flash memory device is described that may include a substrate, a plurality of cell gate patterns and a plurality of mold insulating layers alternately stacked on the substrate, and a vertical channel structure in contact with side surfaces of the plurality of cell gate patterns and side surfaces of the plurality of mold insulating layers. Each of the plurality of cell gate patterns may include a cell gate electrode and a blocking barrier pattern adjacently disposed on one side surface of the cell gate electrode. An inner side surface of the blocking barrier pattern may include an upper inner side surface, a middle inner side surface, and a lower inner side surface. The middle inner side surface of the blocking barrier pattern may face the one side surface of the cell gate electrode. The blocking barrier pattern may have a portion protruding toward the cell gate electrode at a connection point between the upper inner side surface of the blocking barrier pattern and the middle inner side surface of the blocking barrier pattern.

17 Claims, 17 Drawing Sheets

(56) References Cited

U.S. PATENT DOCUMENTS

| | | | |
|---|---|---|---|
| 2013/0207178 A1* | 8/2013 | Lee | H01L 21/32133 257/324 |
| 2015/0014763 A1* | 1/2015 | Lee | H01L 29/7926 257/324 |
| 2015/0279851 A1 | 10/2015 | Fan et al. | |
| 2016/0351582 A1* | 12/2016 | Kim | H01L 27/11582 |
| 2017/0323899 A1* | 11/2017 | Park | H01L 27/11582 |
| 2018/0019134 A1 | 1/2018 | Choi | |
| 2018/0108672 A1 | 4/2018 | Choi et al. | |
| 2018/0269222 A1 | 9/2018 | Huang et al. | |
| 2018/0294272 A1 | 10/2018 | Fan et al. | |
| 2019/0027495 A1 | 1/2019 | Choi et al. | |

FOREIGN PATENT DOCUMENTS

| | | |
|---|---|---|
| KR | 20180041289 A | 4/2018 |
| KR | 101892682 B1 | 8/2018 |
| KR | 20180106963 A | 10/2018 |
| KR | 101933665 B1 | 12/2018 |

* cited by examiner

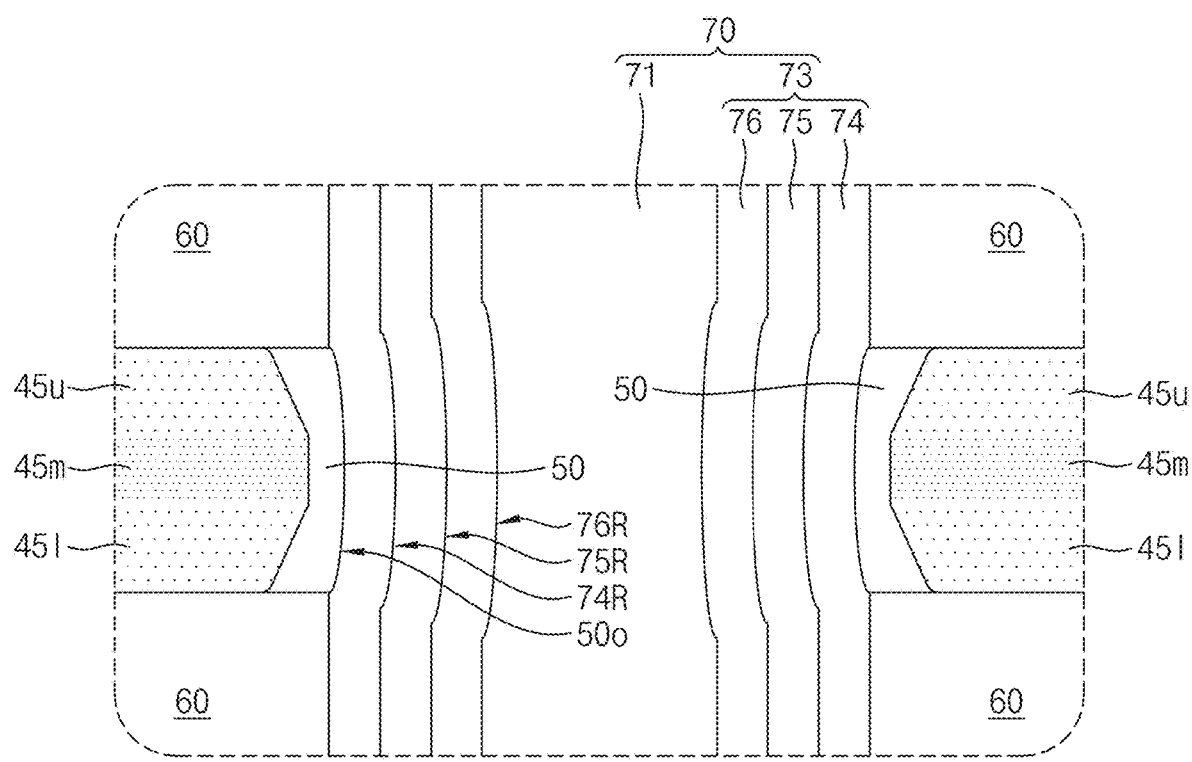

THREE-DIMENSIONAL FLASH MEMORY DEVICE INCLUDING CELL GATE PATTERNS HAVING BLOCKING BARRIER PATTERNS AND A METHOD FOR MANUFACTURING THE SAME

CROSS-REFERENCE TO RELATED APPLICATION

This application claims from Korean Patent Application No. 10-2019-0072284, filed on Jun. 18, 2019, the disclosure of which is incorporated herein by reference in its entirety.

BACKGROUND

1. Field

The disclosure relates to a three-dimensional flash memory device including cell gate patterns having blocking barrier patterns and a method of manufacturing the same.

2. Description of Related Art

A three-dimensional flash memory device is a semiconductor device operated by a cell gate electrode and a field applied to a channel layer. If there is a sharp portion between the cell gate electrode (or cell gate barrier pattern) and the channel layer or charge trap layer, the current may leak and the electric field may be concentrated on the sharp portion, the barrier pattern, the charge trap layer, and/or the tunneling insulating layer at the sharp portion may be physically destroyed.

SUMMARY

Embodiments of the disclosure provide structures including a cell gate electrode, a cell gate barrier pattern, and/or a blocking barrier pattern having rounded or tapered corner portions and methods of fabricating the structures so that electric fields are not to be concentrated between the cell gate electrode and the channel pattern.

For example, a method is proposed in which the nitrogen concentration in the sacrificial insulating layer to form the cell gate electrode and the cell gate barrier pattern is staircase or gradually adjusted to variously shape the shape of the oxidized blocking barrier pattern.

Embodiments of the disclosure provide methods of fabricating the three-dimensional flash memory devices.

According to example embodiments, a three-dimensional flash memory device may include a substrate, a plurality of cell gate patterns and a plurality of mold insulating layers alternately stacked on the substrate, and a vertical channel structure in contact with side surfaces of the plurality of cell gate patterns and side surfaces of the plurality of mold insulating layers. Each of the plurality of cell gate patterns may include a cell gate electrode and a blocking barrier pattern adjacently disposed on one side surface of the cell gate electrode. An inner side surface of the blocking barrier pattern may include an upper inner side surface, a middle inner side surface, and a lower inner side surface. The middle inner side surface of the blocking barrier pattern may face the one side surface of the cell gate electrode. The blocking barrier pattern may have a portion protruding toward the cell gate electrode at a connection point between the upper inner side surface of the blocking barrier pattern and the middle inner side surface of the blocking barrier pattern.

According to example embodiments, a three-dimensional flash memory device may include a substrate, a cell gate pattern and a mold insulating layer stacked on the substrate, and a vertical channel structure abutting side surfaces of the cell gate pattern and the mold insulating layer. The mold insulating layer may include an insulating material. The cell gate pattern may include a cell gate electrode, a conductive inner cell gate barrier pattern, an insulating outer cell gate barrier pattern, and a blocking barrier pattern. The conductive inner cell gate barrier pattern may surround an upper surface of the cell gate electrode, a lower surface of the cell gate electrode, and a side surface of the cell gate electrode. A first surface of the insulating outer cell gate barrier pattern may conformably cover the conductive inner cell gate barrier pattern. An inner side surface of the blocking barrier pattern may be on a second surface of the insulating outer cell gate barrier pattern that is opposite the first surface of the insulating outer cell gate barrier pattern. The inner side surface of the blocking barrier pattern may have a concavo-convex shape including a recessed portion. An outer side surface of the blocking barrier pattern may have a convexly projecting outer side surface.

According to example embodiments, a three-dimensional flash memory device may include a substrate, a plurality of cell gate patterns and a plurality of mold insulating layers alternately stacked on the substrate, and a vertical channel structure in contact with side surfaces of the plurality of cell gate patterns and the plurality of mold insulating layers. The plurality of mold insulating layers may include an insulating material. Each of the plurality of cell gate patterns may include a cell gate electrode and a blocking barrier pattern surrounding one side surface of the cell gate electrode. An inner side surface of the blocking barrier pattern may include an upper inner side surface, a middle inner side surface, and a lower inner side surface. The upper inner side surface and the lower inner side surface of the inner side surface of the blocking barrier pattern may each have a concavo-convex shape.

BRIEF DESCRIPTION OF THE DRAWINGS

FIGS. 3A and 3B to FIG. 8 are longitudinal and enlarged views illustrating methods of forming a three-dimensional flash memory device in accordance with various embodiments.

DETAILED DESCRIPTION OF EXAMPLE EMBODIMENTS

Figure 1:
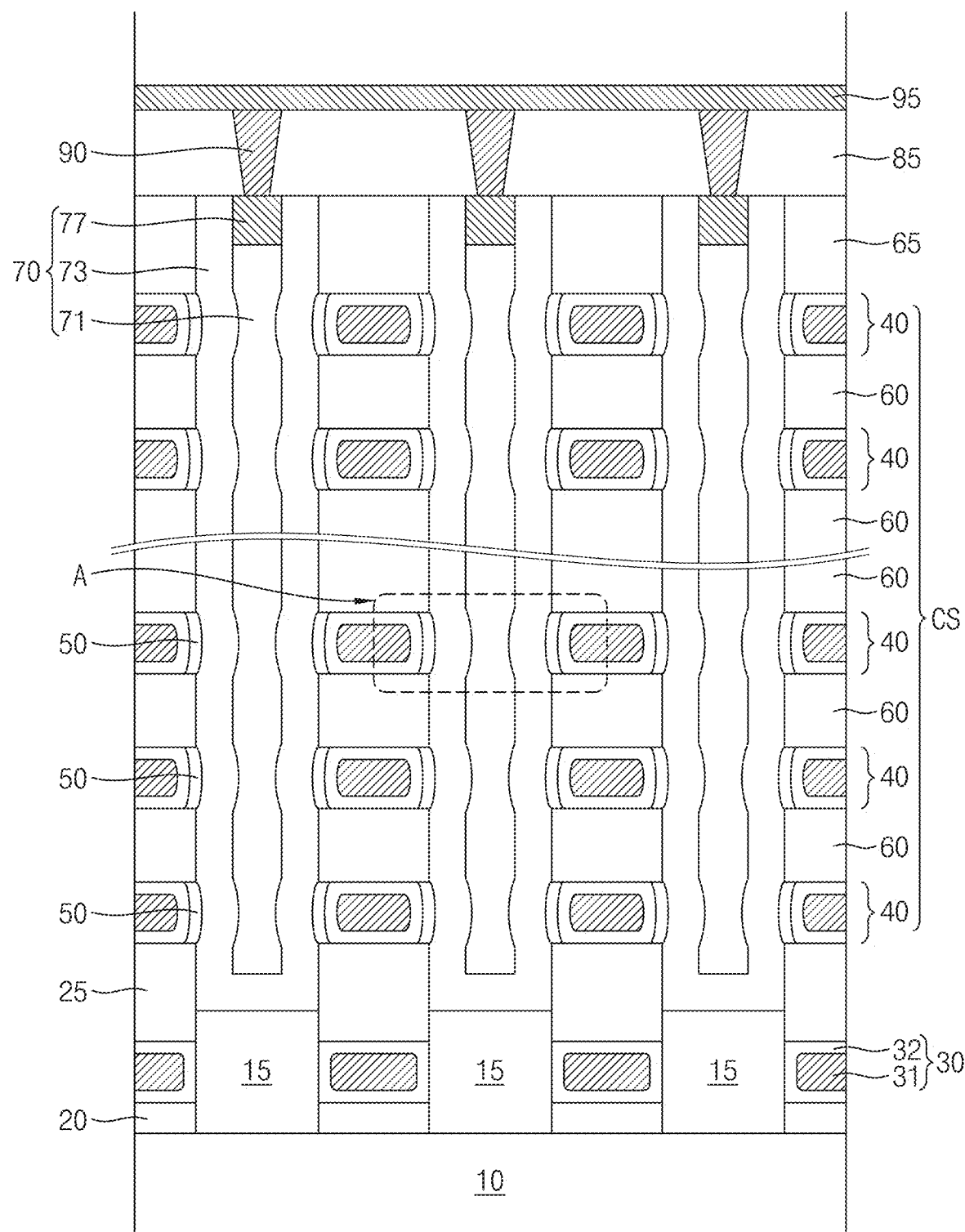
FIG. 1 is a longitudinal sectional view illustrating a three-dimensional flash memory device in accordance with an embodiment.

FIG. 1 is a longitudinal sectional view illustrating a three-dimensional flash memory device in accordance with an embodiment of the disclosure.

Referring to FIG. 1, the three-dimensional flash memory device may include a substrate 10, a surface insulating layer 20, a lower selection gate pattern 30, a lower interlayer insulating layer 25, a cell stack CS, a capping insulating layer 65, a vertical channel structure 70, an upper interlayer insulating layer 85, the via plug 90, and the bit line 95 stacked on the substrate 10. The three-dimensional flash memory device may further include an elevated source region 15 between the substrate 10 and the vertical channel structure 70.

The substrate 10 may include at least one of a single crystalline silicon wafer, a bonded silicon wafer, an epitaxially grown silicon layer, a silicon-on-insulator (SOI) wafer, a deposited polycrystalline silicon layer, a compound semiconductor such as a silicon-germanium (SiGe) layer or a silicon-carbon (SiC) layer, or other semiconducting materials.

The surface insulating layer 20 may include an insulator conformably formed on the surface of the substrate 10. For example, the surface insulating layer 20 may include at least one of a silicon oxide layer, a silicon nitride layer, a silicon oxy-nitride layer, or combinations thereof. In an embodiment, the surface insulating layer 20 may include an oxidized silicon layer. For example, the surface insulating layer 20 may be formed by partially oxidizing the surface of the substrate 10.

The lower selection gate pattern 30 may be disposed between the surface insulating layer 20 and the lower interlayer insulating layer 25. The lower selection gate pattern 30 may include a lower selection gate electrode 31 and a lower selection gate barrier pattern 32. The lower selection gate barrier pattern 32 may conformably cover or surround an upper surface, a lower surface, and side surfaces of the lower selection gate electrode 31. The lower selection gate electrode 31 may have a substantially flat top surface, a substantially flat bottom surface, and a substantially flat side surfaces. The lower selection gate barrier pattern 32 may also have substantially a flat top surface, a flat bottom surface, and a flat outer side surface. The lower selection gate electrode 31 may include a conductor, and the lower selection gate barrier pattern 32 may include a conductive barrier material and/or an insulating barrier material.

The lower interlayer insulating layer 25 may be formed between the lower selection gate pattern 30 and the cell stack CS. The lower interlayer insulating layer 25 may include silicon oxide.

The cell stack CS may include alternately stacked cell gate patterns 40 (also referred to as gate patterns) and mold insulating layers 60 (also referred to as mold layers). Each of the cell gate patterns 40 may include a cell gate electrode 41 (also referred to as a gate electrode 41), a cell gate barrier pattern 42 (also referred to as a gate barrier pattern), and a blocking barrier pattern 50.

The cell gate barrier pattern 42 may conformably cover or surround the top, bottom, and side surfaces of the cell gate electrode 41. The cell gate electrode 41 may have substantially flat top, bottom, and side surfaces. In an embodiment, the cell gate electrode 41 may have rounded side surfaces. The cell gate barrier pattern 42 may also have substantially flat top, bottom, and outer side surfaces. In an embodiment, the cell gate barrier pattern 42 may have rounded side surfaces. The cell gate electrode 41 may include a metal such as tungsten, and the cell gate barrier pattern 42 may include a conductive barrier pattern such as titanium nitride (TiN) and/or an insulating barrier pattern such as aluminum oxide ($Al_2O_3$).

The blocking barrier pattern 50 may be formed on both side surfaces of the cell gate barrier pattern 42. The blocking barrier pattern 50 may be disposed between the cell gate barrier pattern 42 of the cell gate pattern 40 and the vertical channel structure 70. The blocking barrier pattern 50 may include an insulator such as silicon oxide.

The mold insulating layers 60 may be interposed between the cell gate patterns 40, and may include silicon oxide. The capping insulating layer 65 may be formed on the cell stack CS. The capping insulating layer 65 may include silicon oxide. The capping insulating layer 65 and the lower interlayer insulating layer 25 may be formed to be relatively thicker than the mold insulating layers 60.

The vertical channel structure 70 may abut (e.g., be in contact with) the side surfaces of the capping insulating layer 65, the cell stack CS, and the lower interlayer insulating layer 25, and be electrically connected to the substrate 10. For example, the vertical channel structure 70 may vertically penetrate the stacked capping insulating layer 65, the cell stack CS, and the lower interlayer insulating layer 25 to be connected to the elevated source region 15 raised from the substrate 10. The elevated source region 15 may include an epitaxially grown layer. The vertical channel structure 70 may include a central gap-fill pattern 71, a channel pattern 73 surrounding the gap-fill pattern 71, and a via pad 77 on the gap-fill pattern 71. An outer side surface of the via pad 77 may be in contact with and electrically connected with the channel pattern 73. The gap-fill pattern 71 may be formed in a pillar shape, the channel pattern 73 may have a cylinder shape, and the via pad 77 may have a discus shape or a pillar shape. The gap-fill pattern 71 may include an insulator such as silicon oxide. The channel pattern 73 may include multiple layers of insulating layers and a semiconductor layer. For example, the channel pattern 73 may include a silicon nitride layer, a silicon oxide layer, and a polysilicon layer. The via pad 77 may include N-doped polycrystalline silicon doped with N-type impurities such as phosphorus (P) or arsenic (As). In an embodiment, the via pad 77 may further include a metal silicide layer or a metallic compound layer. For example, a lower or an outside of the via pad 77 may include polysilicon, and an upper or an inside may include a metal silicide layer or a metal compound layer. The metal silicide layer may include at least one of tungsten silicide (WSi), cobalt silicide (CoSi), titanium silicide (TiSi), nickel silicide (NiSi), or various other metal silicides, and the metal compound layer may include at least one of titanium nitride (TiN), tantalum nitride (TaN), tungsten nitride (WN), aluminum nitride (AlN), or various other metal compounds. The vertical channel structure 70 may have a circular shape in a top view. Thus, in a top view, the channel pattern 73 may have a disc shape, and the gap-fill pattern 71 may have a circular shape.

The upper interlayer insulating layer 85 may cover or surround the capping insulating layer 65 and the vertical channel structure 70. The upper interlayer insulating layer 85 may include silicon oxide. The via plug 90 may be connected to the via pad 77 of the vertical channel structure 70 by vertically passing through the upper interlayer insulating layer 85. The via plug 90 may include at least one of a metal, a metal compound, or a metal suicide. The bit line 95 may be formed in a line shape on the upper interlayer insulating layer 85. The bit line 95 may be electrically connected to the vertical channel structure 70 through the via plug 90.

FIGS. 2A to 2K are enlarged views illustrating the "A" region in FIG. 1 to illustrate the cell gate pattern 40 and vertical channel structure 70 in accordance with various embodiments.

Figure 2A:
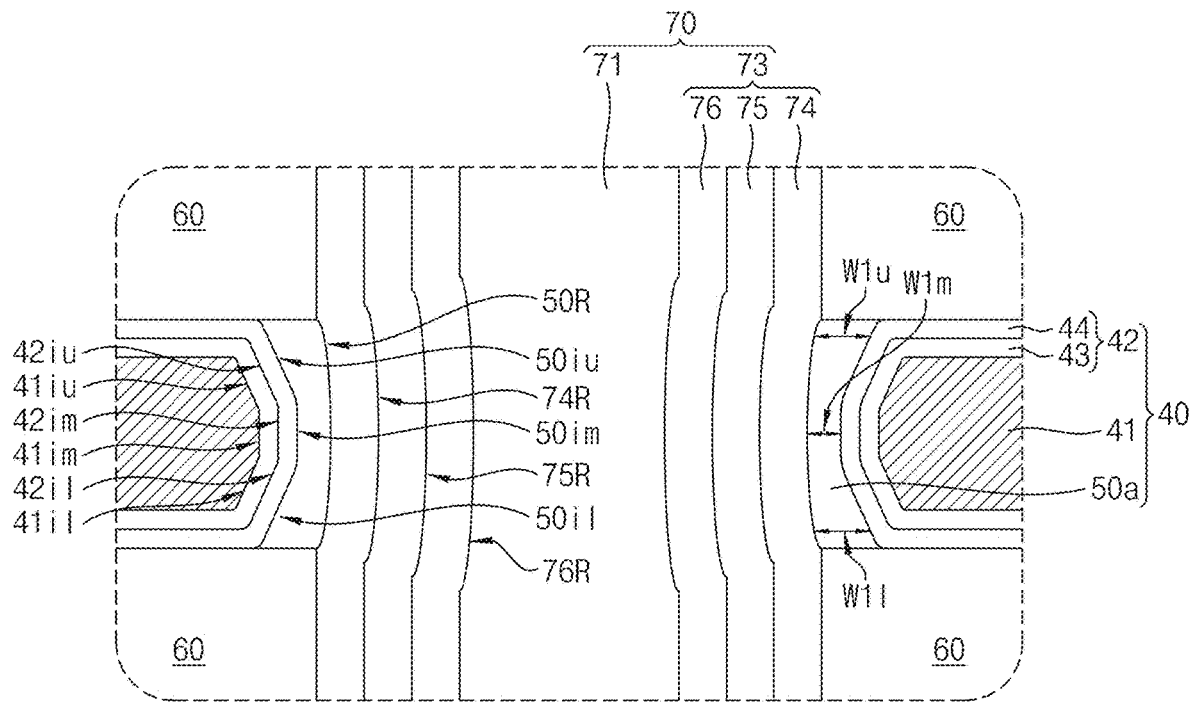
FIGS. 2A to 2N are enlarged views illustrating the "A" region in FIG. 1 to illustrate a cell gate pattern and a vertical channel structure in accordance with various embodiments.

Referring to FIG. 2A, a cell gate pattern 40 in accordance with an embodiment may include a cell gate electrode 41, a cell gate barrier pattern 42, and a blocking barrier pattern 50a. The cell gate barrier pattern 42 may include an inner cell gate barrier pattern 43, which also referred to as a conductive barrier layer 43, and an outer cell gate barrier pattern 44, which may also referred to as an insulating barrier layer 44. The inner cell gate barrier pattern 43 may conformably cover or surround the outer surface, e.g., top, side, and bottom surfaces of the cell gate electrode 41. The inner cell gate barrier pattern 43 may include a conductive material. For example, the inner cell gate barrier pattern 43 may include a diffusion barrier material such as titanium nitride (TiN). The outer cell gate barrier pattern 44 may conformably cover or surround the outer surface, e.g., the top, side, and the bottom surfaces of the inner cell gate barrier pattern 43. The outer cell gate barrier pattern 44 may include an insulating barrier material having a higher work function such as aluminum oxide ($Al_2O_3$). The blocking barrier pattern 50a may be adjacently disposed on one side surface of the cell gate electrode 41.

The channel pattern 73 may include a charge trap layer 74, a tunneling insulating layer 75, and a channel layer 76. The charge trap layer 74 may be formed on the outer side surface of the blocking barrier pattern 50a and on the outer side surface of the mold insulating layer 60. The charge trap layer 74 may include an insulator having a relatively high dielectric constant so as to trap electrons. For example, the charge trap layer 74 may include silicon nitride. The tunneling insulating layer 75 may include an insulator having a relatively low work function so that electrons can tunnel. For example, the tunneling insulating layer 75 may include silicon oxide. The channel layer 76 may include a semiconducting material to which electrons can move. For example, channel layer 76 may include an intrinsic semiconductor layer such as un-doped polysilicon. In an embodiment, the channel layer 76 may include a P-doped polysilicon doped with P-type impurities including boron (B), gallium (Ga), or indium (In), or an N-doped polysilicon doped with N-type impurities including at least one of phosphorus (P), arsenic (As), or antimony (Sb). The channel layer 76 may be formed to surround the side surfaces of the gap-fill pattern 71. The tunneling insulating layer 75 may be formed to surround the outer side surfaces of the channel layer 76. The charge trap layer 74 may be formed to surround the outer side surfaces of the tunneling insulating layer 75.

An inner side surface of the blocking barrier pattern 50a may include an upper inner side surface 50iu (also referred to as upper sidewall surface 50iu), a middle inner side surface 50im (also referred to as middle sidewall surface 50im), and a lower inner side surface 50il (also referred to as lower sidewall surface 50il). The inner side surface of the blocking barrier pattern 50a may face the gate electrode 41 and may be opposite an outer sidewall of the blocking barrier pattern 50a. The upper inner side surface 50iu may have a downward slope from the cell gate electrode 41 or the cell gate barrier pattern 42 to the charge trap layer 74 of the channel pattern 73 of the vertical channel structure 70. The middle inner side surface 50im may be substantially vertically flat. The lower inner side surface 50il may have an upward slope from the cell gate electrode 41 or the cell gate barrier pattern 42 toward the charge trap layer 74 of the channel pattern 73 of the vertical channel structure 70. For example, the upper inner side surface 50iu, the middle inner side surface 50im, and the lower inner side surface 50il may be inclined such that the middle inner side surface 50im is concavely recessed laterally. The upper inner side surface 50iu, the middle inner side surface 50im, and the lower inner side surface 50il of the blocking barrier pattern 50a may correspond to an interface between the blocking barrier pattern 50a and the cell gate barrier pattern 42, or the outer side surface of the cell gate barrier pattern 42. Accordingly, the interface between the blocking barrier pattern 50a and the cell gate barrier pattern 42, or the outer side surface of the cell gate barrier pattern 42 may have an upper portion with a downward slope, a substantially vertically flat middle portion, and a lower portion with an upward slope.

Owing to the inner cell gate barrier pattern 43 and the outer cell gate barrier pattern 44 of the cell gate barrier pattern 42 respectively have a conformal profile, the side surface interfaces 42iu, 42im, and 42il between the inner cell gate barrier pattern 43 and the outer cell gate barrier pattern 44 may also have an upper side surface interface 42iu with the downward slope, a middle side surface interface 42im with the substantially vertically flat, and a lower side interface 42il with the upward slope to be in parallel with the upper inner side surface 50iu, the middle inner side surface 50im, and the lower inner side surface 50il of the blocking barrier pattern 50a. The upper side interface 42iu, the middle side interface 42im, and the lower side interface 42il between the inner cell gate barrier pattern 43 and the outer cell gate barrier pattern 44 may correspond to an upper outer side surface (also referred to as upper region of outer sidewall), a middle outer side surface (also referred to as middle region of outer sidewall), and a lower outer side surface (also referred to as lower region of the outer sidewall) of the inner cell gate barrier pattern 43 (also referred to as conductive barrier), and an upper inner side surface, a middle inner side surface, and a lower inner side surface of the outer cell gate barrier pattern 44, respectively. In addition, the side interfaces 41iu, 41im, and 41il between the cell gate electrode 41 and the cell gate barrier pattern 42 may also include the upper side interface 41iu with a downward slope, the middle side interface 41im with substantially vertically flat, and the lower side interface 41il with an upward slope to be in parallel with the upper side surface 42iu, 42im, and 42il, respectively. The side interfaces 41iu, 41im, and 41il between the cell gate electrode 41 and the cell gate barrier pattern 42 may be correspond to the outer side surfaces of the cell gate electrode 41, the inner side surfaces of the cell gate barrier pattern 42, or the inner side surface of the inner cell gate barrier pattern 43. The cell gate electrode 41 may include one side surface along the side interfaces 41iu, 41im, and 41il between the cell gate electrode 41 and the cell gate barrier pattern 42. An upper segment of the one side surface of the cell gate electrode 41 may extend along the upper side interface 41iu. A middle segment of the one side surface of the cell gate electrode 41 may extend along the middle side interface 41im. A lower segment of the one side surface of the cell gate electrode 41 may extend along the lower side interface 41il.

A first surface (e.g., inner surface) of the outer cell gate barrier pattern 44 (also referred to as insulating barrier layer 44) may cover or surround the inner cell gate barrier pattern 43. The first surface of the outer cell gate barrier pattern 44 may have an upper side surface, middle side surface, and a lower side surface corresponding the to the upper inner side surface 50iu, the middle inner side surface 50im, and the lower inner side surface 50il of the blocking barrier pattern 50, respectively. A second surface of the outer cell gate barrier pattern 44 may be opposite the first surface of the outer cell gate barrier pattern 44.

An outer side surface 50R (also referred to as outer sidewall) of the blocking barrier pattern 50a may convexly protrude toward the channel pattern 73 of the vertical channel structure 70. The outer side surface 50R of the blocking barrier pattern 50a may be rounded. An outer side surface 74R of the charge trap layer 74, an outer surface 75R of the tunneling insulating layer 75, and an outer side surface 76R of the channel layer 76 may be partially concavely recessed along the outer side surface 50R of the blocking barrier pattern 50a. The outer side surface 74R of the charge trap layer 74 may have a radius of curvature greater than the outer side surface 50R of the blocking barrier pattern 50a, and the outer side surface 75R of the tunneling insulating layer 75 may have a radius of curvature greater than the outer side surface 75R of the charge trap layer 74, and the outer side surface 76R of the channel layer 76 may have a radius of curvature greater than the outer side surface 75R of the tunneling insulating layer 75. (50R<74R<75R<76R) The outer side surface 50R of the blocking barrier pattern 50a may correspond to an interface between the blocking barrier pattern 50a and the charge trap layer 74 or the inner sided surface of the charge trap layer 74. The outer side surface 74R of the charge trap layer 74 may correspond to the interface of the charge trap layer 74 and the tunneling insulating layer 75 or the inner side surface of the tunneling insulating layer 75. The outer side surface 76R of the tunneling insulating layer 75 may correspond to the interface between the tunneling insulating layer 75 and the channel layer 76 or the inner side surface of the channel layer 76. The outer side surface 76R of the channel layer 76 may correspond to an interface between the channel layer 76 and the gap-fill pattern 71 or the outer side surface of the gap-fill pattern 71.

The blocking barrier pattern 50a may have a profile similar to a cross-section of a concave lens. For example, an upper horizontal width W1u of the blocking barrier pattern 50a and the lower horizontal width W1l may be thicker than the middle horizontal width W1m. (W1u>W1m, W1l>W1m) The upper horizontal width W1u of the blocking barrier pattern 50a and the lower horizontal width W1l may be substantially the same or similar. The horizontal width W1u of the upper portion and the horizontal width W1l of the lower portion of the blocking barrier pattern 50a may be set to a level close to the interfaces between the blocking barrier pattern 50a and the mold insulating layer 60. The horizontal width W1m of the middle portion of the blocking barrier pattern 50a can be measured in the middle of the blocking barrier pattern 50a, for example, about one half of the vertical height.

Figure 2B:
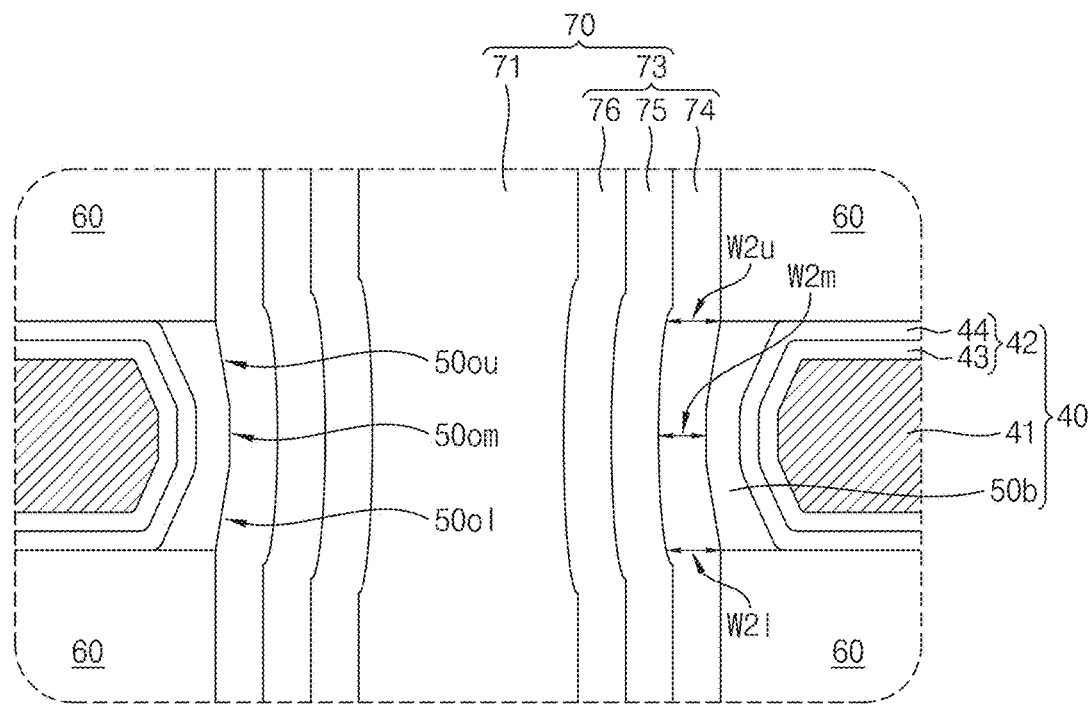

Referring to FIG. 2B, the blocking barrier pattern 50b of the cell gate pattern 40 in accordance with an embodiment may include an upper inner side surface 50iu and an upper outer side surface 50ou with a downward slope, a substantially vertical flat middle inner side surface 50im and the middle outer side surface 50om, and the lower inner side surface 50il and the lower outer side surface 50o1 with an upward slope. The upper outer side surface 50ou, the middle outer side surface 50om, and the lower outer side surface 50o1 of the blocking barrier pattern 50b may correspond to an upper inner side surface, a middle inner side surface, and a lower inner side surface of the charge trap layer 74, respectively. Accordingly, the charge trap layer 74 may have an upper inner side surface 50ou with a downward slope, a substantially vertically flat middle inner side surface 50om, and a lower inner side surface 50o1 with an upward slope. The upper outer side surface 50ou, the middle outer side surface 50om, and the lower outer side surface 50o1 of the blocking barrier pattern 50b may correspond to an interface between the blocking barrier pattern 50b and the charge trap layer 74. Thus, a side interface between the blocking barrier pattern 50b and the charge trap layer 74 may have an upper side interface 50ou with a downward slope, a substantially vertically flat middle side interface 50om, and a lower side interface 50o1 with an upward slope. The horizontal width W2u and the lower horizontal width W2l of the upper portion of the charge trap layer 74 of the channel pattern 73 abutting the blocking barrier pattern 50b may be thicker or wider than the horizontal width W2m of the middle portion. (W2u>W2m, W2l>W2m) The upper horizontal width W2u and the lower horizontal width W2l of the channel pattern 73 may be substantially the same or similar. (W2u≈W2l) The upper horizontal width W2u and the lower horizontal width W2l of the channel pattern 73 may be measured at the same level as the side interfaces between the blocking barrier pattern 50b and the mold insulating layer 60, respectively. The horizontal width W2m of the middle portion of the channel pattern 73 may be measured at a half level of the vertical height of the upper portion 50b. Other elements can be understood with further reference to FIG. 2A.

Figure 2C:
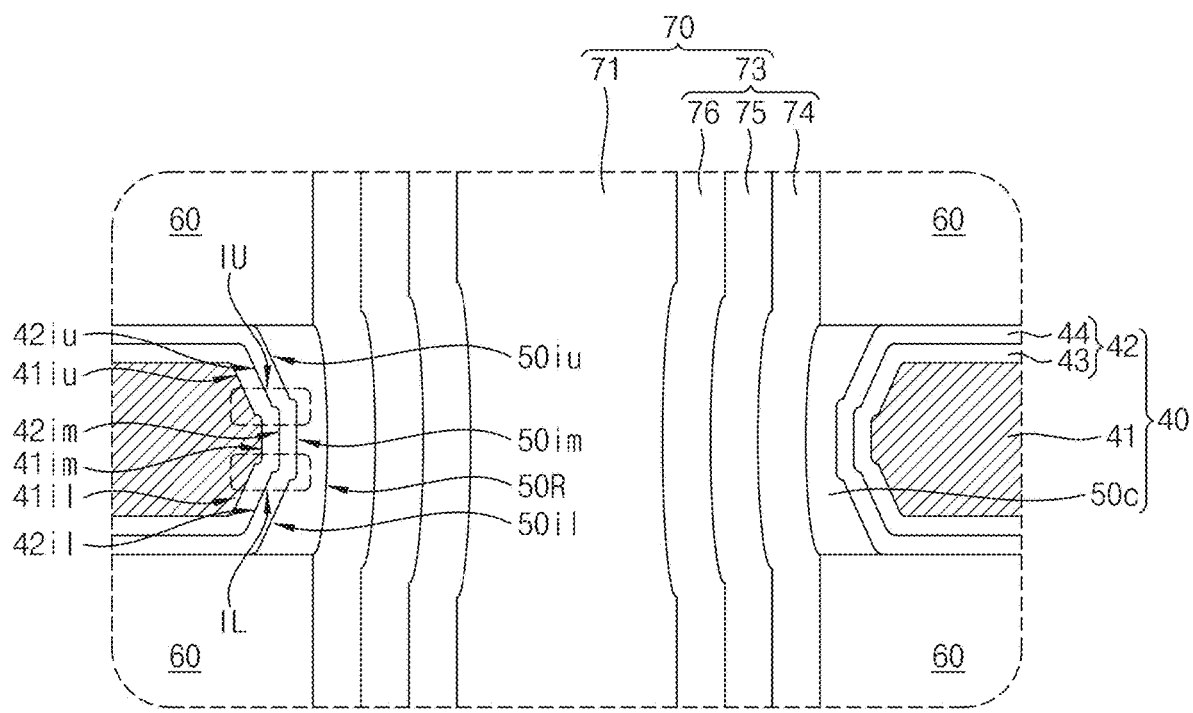

Referring to FIG. 2C, the blocking barrier pattern 50c of the cell gate pattern 40 in accordance with an embodiment may include an upper inner side surface 50iu with a downward slope, a substantially vertically flat middle inner side surface 50im, a lower inner side surface 50il with an upward slop, and a rounded outer side surface 50R which protrudes convexly toward the channel pattern 73 of the vertical channel structure 70. Compared with FIG. 2A, a connection point between the upper inner side surface 50iu and the middle inner side surface 50im of the blocking barrier pattern 50c and a connection point between the lower inner side surface 50il and the middle inner side surface 50im of the blocking barrier pattern 50c may have inflection points (IU, IL). The inflection points IU and IL may have staircase difference. The side interfaces 42iu, 42im, and 42il between the inner cell gate barrier pattern 43 and the outer cell gate barrier pattern 44, and the side interfaces 41iu, 41im, and 42il between the cell gate electrode 41 and the cell gate barrier pattern 42 may have inflection points IU and IL, respectively. Other elements can be understood with further reference to FIGS. 2A and 2B.

Figure 2D:
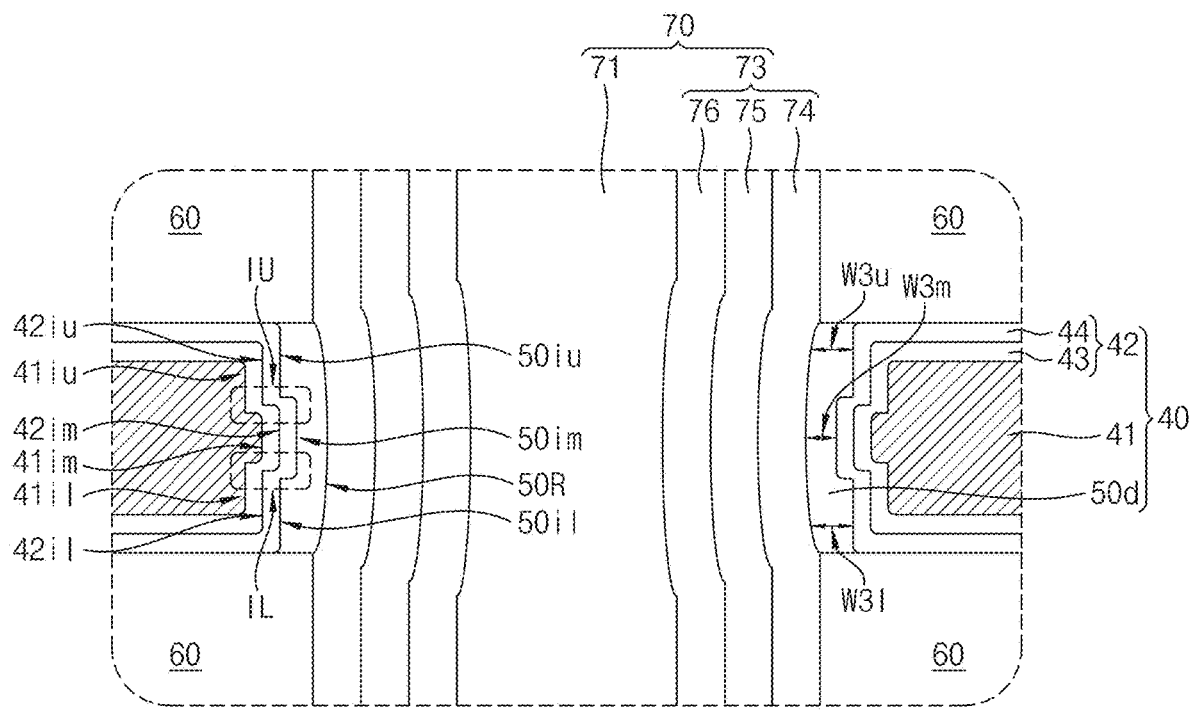

Referring to FIG. 2D, the blocking barrier pattern 50d of the cell gate pattern 40 in accordance with an embodiment includes a substantially vertically flat upper inner side surface 50iu, a middle inner side surface 50im, and a lower inner side surface 50il. Accordingly, the side surface interfaces 42iu, 42im, and 42il between the inner cell gate barrier pattern 43 and the outer cell gate barrier pattern 44 may also be substantially vertically flat and the side interfaces 41iu, 41im, and 41il between the cell gate electrode 41 and the cell gate barrier pattern 42 may also be substantially vertically flat. Referring to FIG. 2D, the connection point between the upper inner side surface 50iu and the middle inner side surface 50im of the blocking barrier pattern 50c, the connection point between the lower inner side surface 50il and the middle inner side surface 50im of the blocking barrier pattern 50c, and the connection points between the side interfaces 42iu, 42im, and 42il between the inner cell gate barrier pattern 43 and the outer cell gate barrier pattern 44, and the side interfaces 41iu, 41im, and 41il between the cell gate electrode 41 and the cell gate barrier pattern 42 may also have inflection points IU, IL, respectively. The blocking barrier pattern 50c may include a rounded outer side surface 50R protruding convexly toward the channel pattern 73 of the vertical channel structure 70. The average horizontal width W3u between the upper inner side surface 50iu and the outer side surface 50R of the blocking barrier pattern 50d is greater than the average horizontal width W3m between the middle inner side surface 50im and the outer side surface 50R. (W3u>W3m) The average horizontal width W3l between the lower inner side surface 50il and the outer side surface 50R of the blocking barrier pattern 50d may less than the average horizontal width W3m between the middle inner side surface 50im and the outer side surface 50R.

(W3l>W3m) The average horizontal width W3u between the upper inner side surface 50iu and the outer side surface 50R of the blocking barrier pattern 50d and the average horizontal width W3u between the lower inner side surface 50il ant the outer side surface 50R of the blocking barrier pattern 50d may be substantially the same or similar to each other. (W3u≈W3l) Other elements can be understood with further reference to FIGS. 2A to 2C.

Figure 2E:
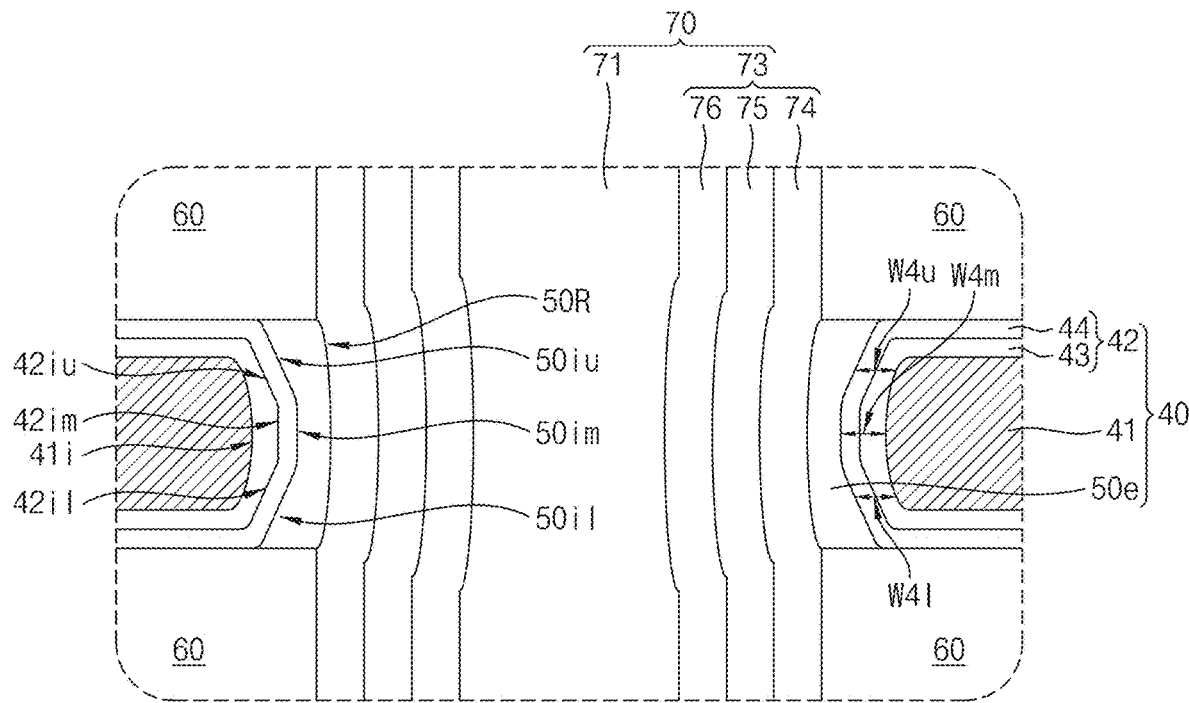

Referring to FIG. 2E, the blocking pattern 50e of the cell gate pattern 40 in accordance with an embodiment may include an upper inner side surface 50iu with a downward slope, a substantially vertically flat middle inner side surface 50im, and a lower inner side surface 50il with an upward slope. The side interfaces 42iu, 42im, and 42il between the inner cell gate barrier pattern 43 and the outer cell gate barrier pattern 44 of the cell gate barrier pattern 42 may include the upper side interface 42iu with the downward slope, the vertically flat middle side surface 50im, and the lower side interface 42il with the upward slope. The middle side interface 42im may be vertically flat. The side interface 41i between the cell gate electrode 41 and the cell gate barrier pattern 42 may be substantially rounded. For example, the average horizontal width W4u between the top inner side surface 50iu of the blocking barrier pattern 50e and the cell gate electrode 41 may be less than the average horizontal width W4m between the middle inner side surface 50im of the blocking barrier pattern 50e and the cell gate electrode 41. (W4u<W4m) The average horizontal width W4l between the lower inner side surface 50il of the blocking barrier pattern 50e and the cell gate electrode 41 is less than the average horizontal width W4m between the middle inner side surface 50im of the blocking barrier pattern 50e and the electrodes 41. (W4l<W4m) The average horizontal width W4u between the upper inner side surface 50iu of the blocking barrier pattern 50e and the cell gate electrode 41 and the average horizontal width W4l between the lower inner side surface 50il of the blocking barrier pattern 50e and the cell gate electrodes 41 may be substantially the same or similar to each other. In an embodiment, the side interfaces 42iu, 42im, and 42il between the inner cell gate barrier pattern 43 and the outer cell gate barrier pattern 44 of the cell gate barrier pattern 42 may be also substantially rounded.

Figure 2F:
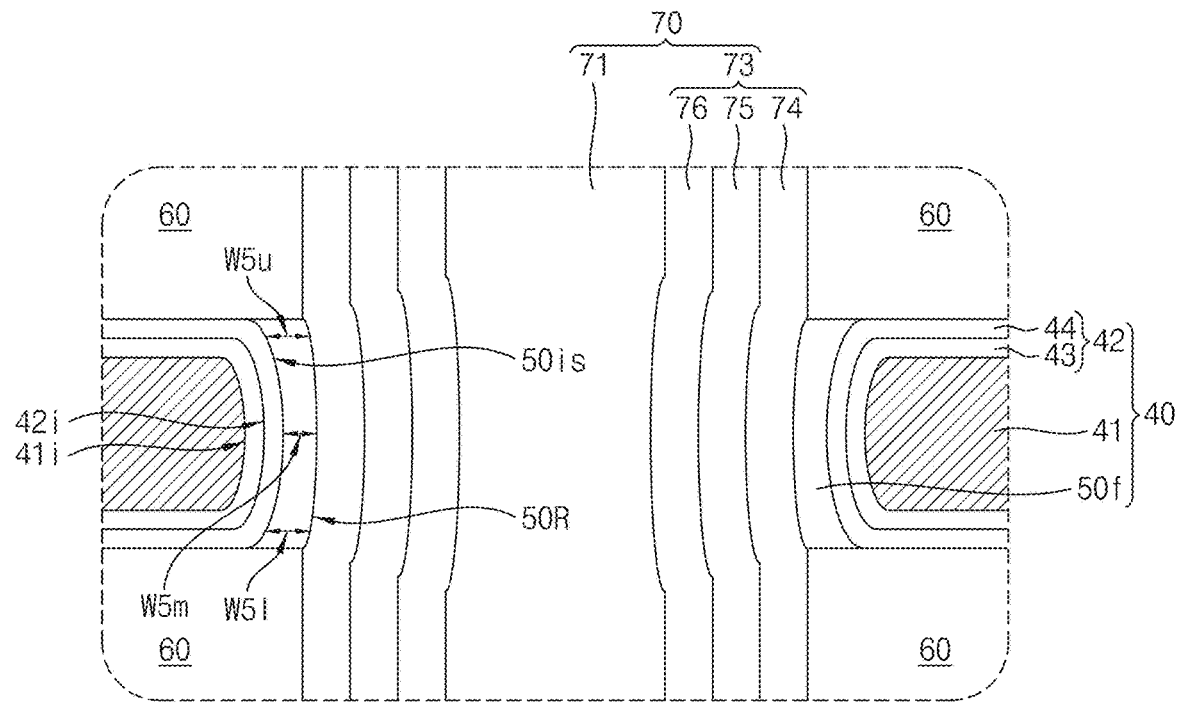

Referring to FIG. 2F, the blocking barrier pattern 50f of the cell gate pattern 40 in accordance with an embodiment may include a rounded inner side surface 50is and a rounded outer side surface 50R. The horizontal width W5u of the upper portion and the horizontal width W5l of the lower portion may be greater than the horizontal width W5m of the middle portion. (W5u>W5m, W5l>W5m) The upper horizontal width W5u and the lower horizontal width W5l may be substantially the same or similar to each other. The side interface 42I between the inner cell gate barrier pattern 43 and the outer cell gate barrier pattern 44 of the cell gate barrier pattern 42 may be substantially parallel or concentric with the inner side surface 50is of the blocking barrier pattern 50f. The side interface 41I between the cell gate electrode 41 and the cell gate barrier pattern 42 may be also substantially parallel or concentric with the side interface 42I between the inner cell gate barrier pattern 43 and the outer cell gate barrier pattern 44 of the cell gate barrier pattern 42.

Figure 2G:
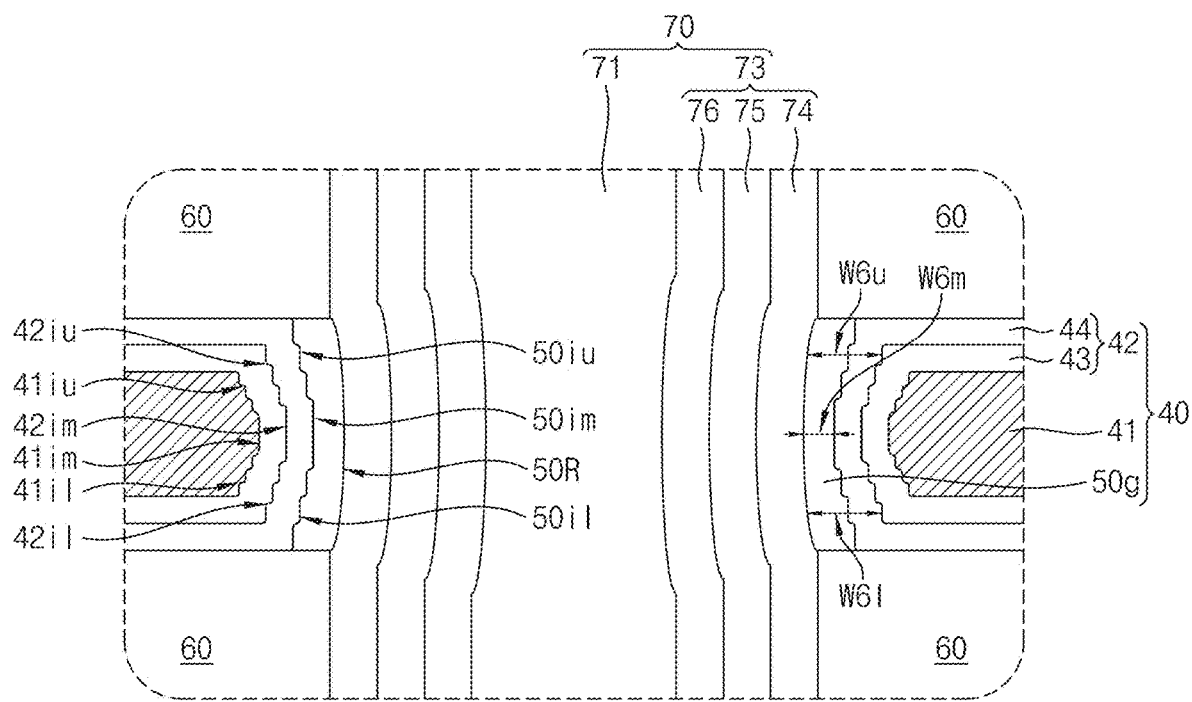

Referring to FIG. 2G, the blocking barrier pattern 50g of the cell gate pattern 40 in accordance with an embodiment includes an upper inner side surface 50iu and a lower inner side surface 50il having a staircase, and a substantially vertically flat middle inner side surface 50im. For example, the upper inner side surface 50iu and the lower inner side surface 50il may have a wound or serpentine shape or concave-convex shape to protrude toward or recessed from the cell gate electrode 41. The middle inner side surface 50im may be substantially vertically flat. The blocking barrier pattern 50g may include a rounded outer side surface 50R to protrude toward the vertical channel structure 70. The side interfaces 42iu, 42im, and 42il between the inner cell gate barrier pattern 43 and the outer cell gate barrier pattern 44 of the cell gate barrier pattern 42 and the upper inner side surface 50iu, the middle inner side surface 50im, and the lower inner side surface 50il of the blocking barrier pattern 50g may have the same shape or similar to each other, respectively. The side interfaces 41iu, 41im, and 41il between the gate electrode 41 and the cell gate barrier pattern 42 may have the same shape as or similar to the interfaces 42iu, 42im, and 42il between the upper inner side surface 50iu, the middle inner side surface 50im, and the lower inner side surface 50iu of the blocking barrier pattern 50g, or between the inner cell gate barrier pattern 43 and the outer cell gate barrier pattern 44 of the cell gate barrier pattern 42. The horizontal width W6u of the upper portion and the horizontal width W6l of the lower portion of the blocking barrier pattern 50g may be greater than the horizontal width W6m of the middle portion of the blocking barrier pattern 50g. (W6u>W6m, W6l>W6m) The upper horizontal width W6u and the lower horizontal width W6l of the blocking barrier pattern 50g may be substantially the same or similar to each other. As mentioned above, the horizontal width W6u of the upper portion and the horizontal width W6l of the lower portion of the blocking barrier pattern 50g can be measured at closer levels of interfaces between the blocking barrier pattern 50g and the mold insulating layer 60. The horizontal width W6m of the middle portion of the blocking barrier pattern 50g can be measured in the middle portion of the blocking barrier pattern 50g, for example, at about half of the vertical height.

Figure 2H:
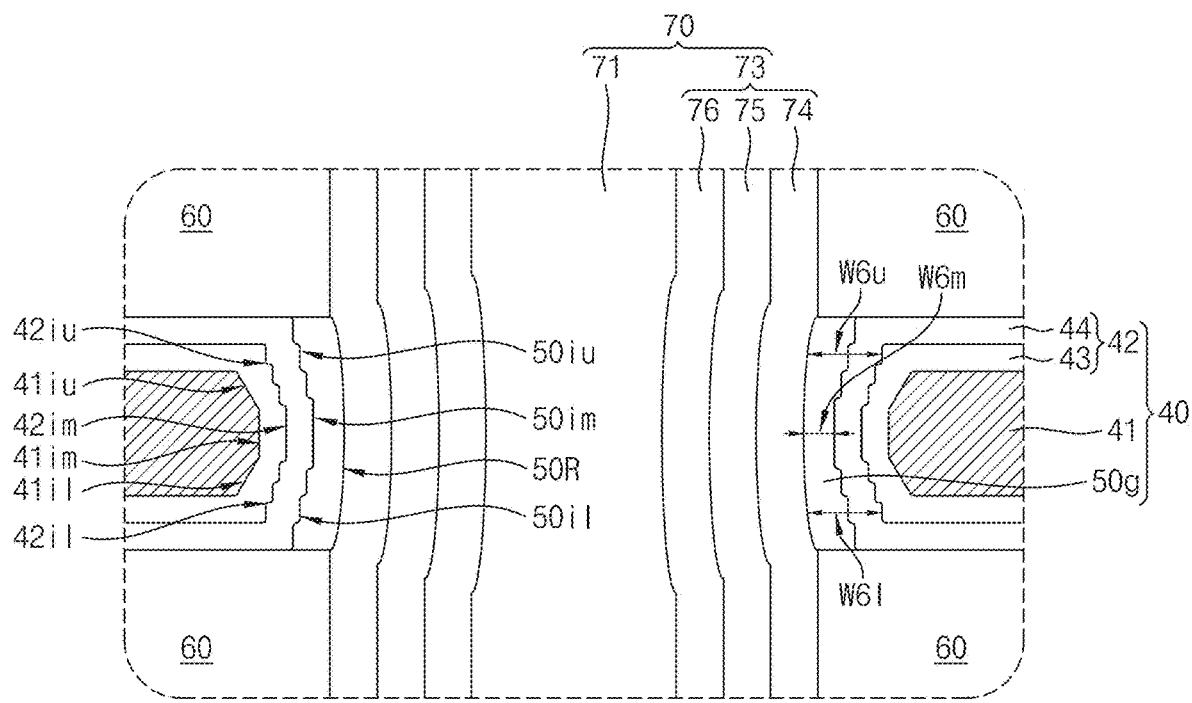

Referring to FIG. 2H, the side interfaces 41iu, 41im, and 41il between the cell gate electrode 41 of the cell gate pattern 40 and the cell gate barrier pattern 42 in accordance with an embodiment may be substantially planar. For example, the side interfaces 41iu, 41im, and 41il of the cell gate electrode 41 and the cell gate barrier pattern 42 may have an upper side interface 41iu with a downward slope, a substantially vertical flat middle interface 41im, and a lower side interface 41il with an upward slope. Profiles of the inner side surfaces 50iu, 50im, and 50il of the blocking barrier pattern 50g can be relaxed smoothly by the cell gate barrier pattern 42.

Figure 2I:
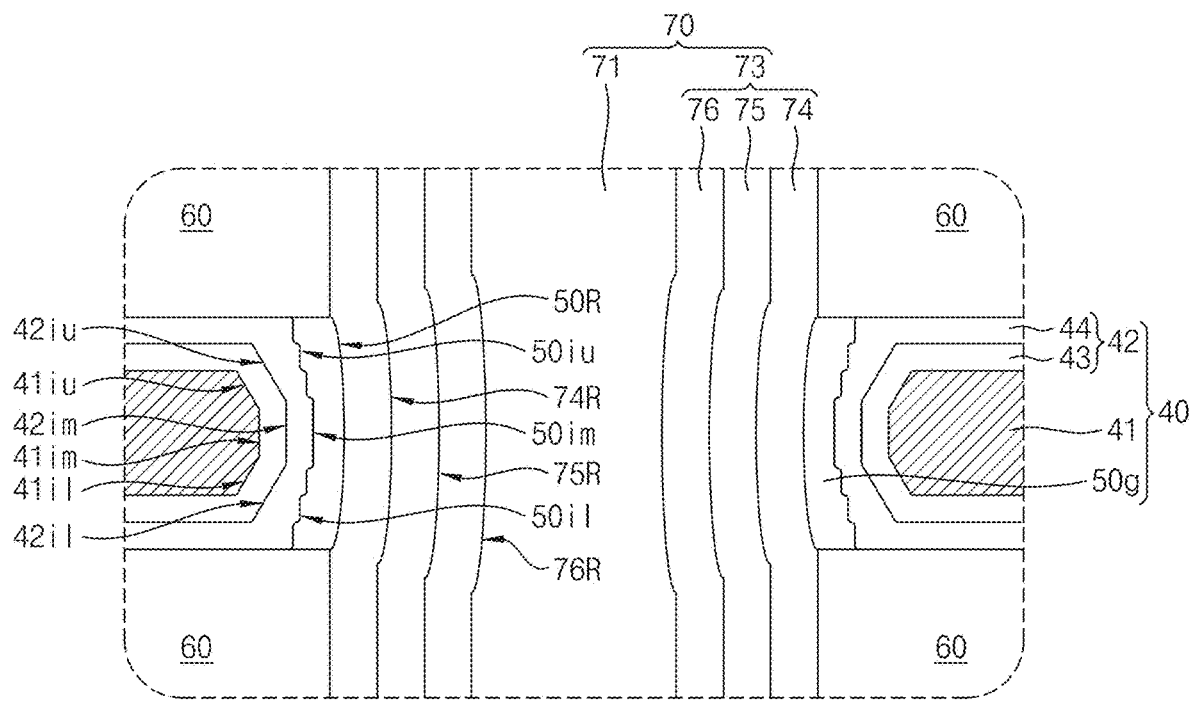

Referring to FIG. 2I, the side interfaces 42iu, 42im, and 42il between the inner cell gate barrier pattern 43 and the outer cell gate barrier pattern 44 of the cell gate barrier pattern 42 of the cell gate pattern 40 in accordance with an embodiment may be substantially flat. For example, the side interfaces 42iu, 42im, and 42il between the inner cell gate barrier pattern 43 and the outer cell gate barrier pattern 44 of the cell gate barrier pattern 42 may have an upper side interface 42iu with a downward slope, a substantially vertically flat middle side interface 42im, and a lower side interface 42il with an upward slope. The profile of the inner side surfaces 50iu, 50im, and 50il of the blocking barrier pattern 50g can be smoothly relaxed by the outer cell gate barrier pattern 44 of the cell gate barrier pattern 42.

Figure 2J:
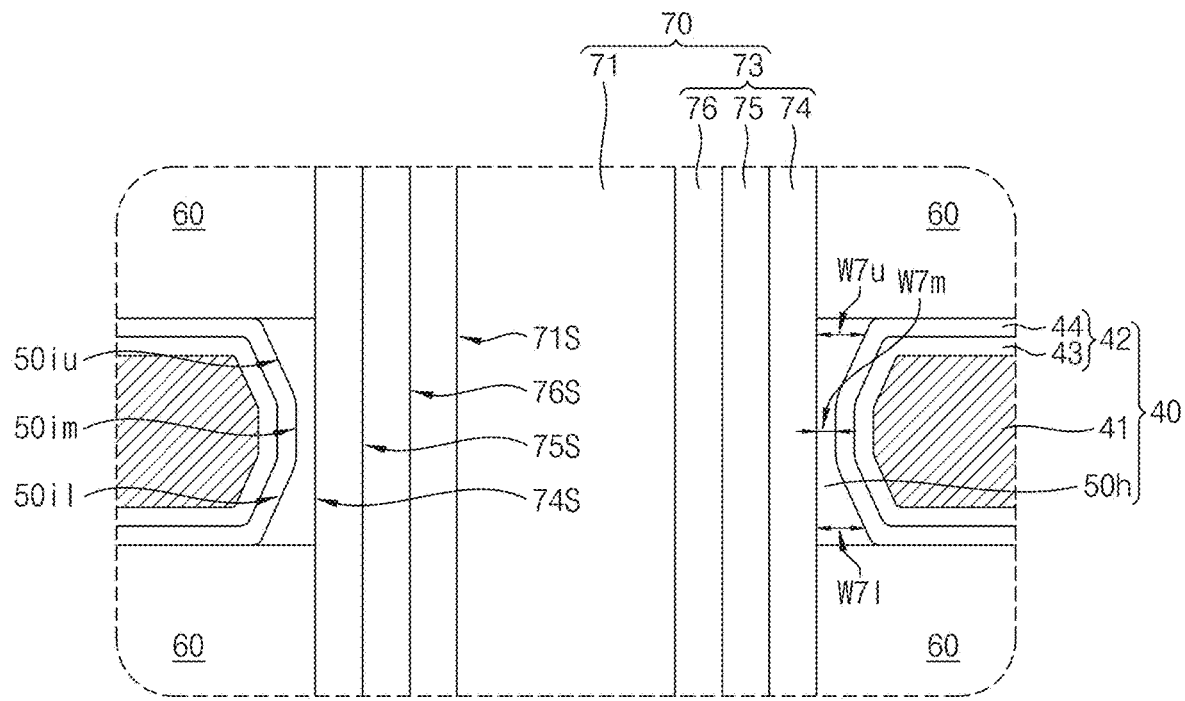

Referring to FIG. 2J, the blocking barrier pattern 50h of the cell gate pattern 40 in accordance with an embodiment may include an upper inner side surface 50iu with a downward slope, a substantially vertically flat middle inner side surface 50*im*, a lower inner side surface 50*il* with an upward slop, and a substantially vertical flat outer side surface 50*o*. The outer side surface 50*o* of the blocking barrier pattern 50*h* may correspond to the outer side surface 74*s* of the charge trap layer 74 of the channel pattern 73 of the vertical channel structure 70. For example, the charge trap layer 74, the tunneling insulator layer 75, the channel layer 76, and the gap-fill pattern 71 of the channel pattern 73 of the vertical channel structure 70 may have substantially vertically flat side surfaces 74S, 75S, 76S, and 71S. Therefore, the horizontal width W7*u* of the upper portion and the horizontal width W7*l* of the lower portion of the blocking barrier pattern 50*h* may be thicker than the horizontal width W7*m* of the middle portion. (W7*u*>W7*m*, W7*l*>W7*m*) The upper horizontal width W7*u* and the lower horizontal width W7*l* of the blocking barrier pattern 50*h* may be substantially the same or similar.

Figure 2K:
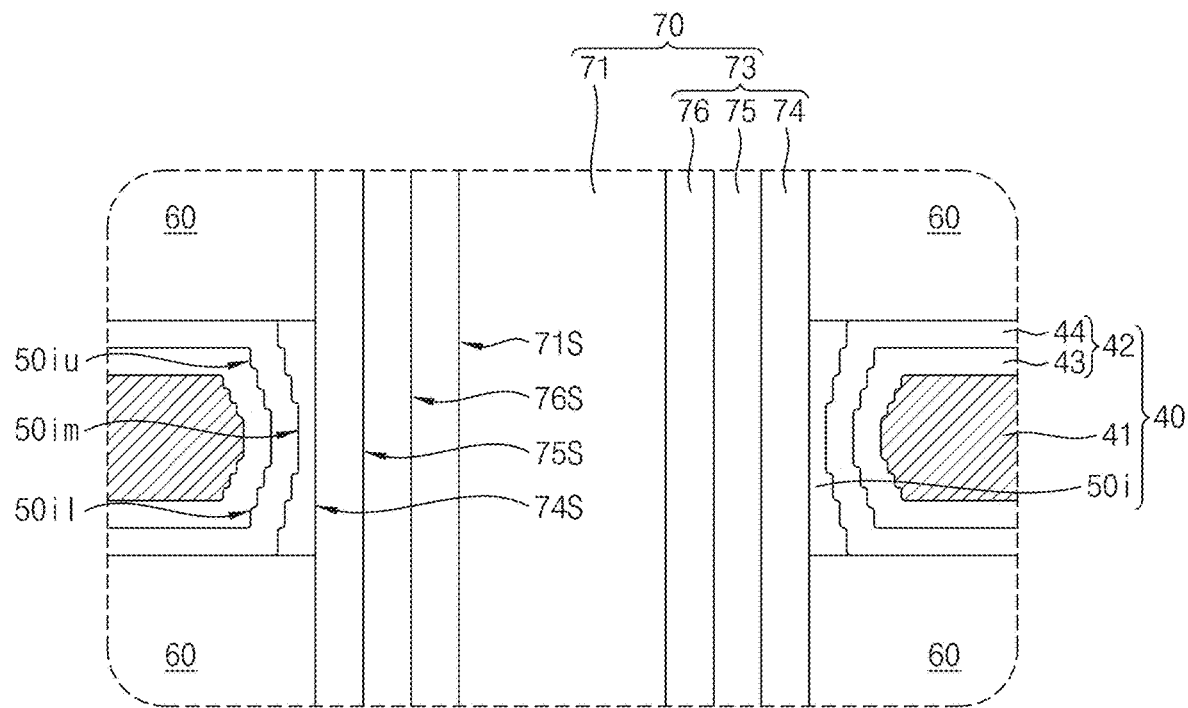

Referring to FIG. 2K, the blocking pattern 50*i* of the cell gate pattern 40 in accordance with an embodiment includes an upper inner side surface 50*iu* and a lower inner side surface 50*il* having a plurality of staircase shapes, a substantially vertical flat middle inner side surface 50*im* and an outer side surface 50*o*. For example, the top inner side surface 50*iu* and the bottom inner side surface 50*il* may have a winding or serpentine shape, or a plurality of stair-like shapes. For example, the charge trap layer 74, the tunneling insulator layer 75, the channel layer 76, and the gap-fill pattern 71 of the channel pattern 73 of the vertical channel structure 70 may be substantially vertically flat outer side surfaces 74S, 75S, 76S, and 71S. The inventive concepts of FIGS. 4A and 4B can be applied, in whole or in part, to the embodiments described with reference to the other drawings. In FIGS. 2B to 2K, elements not illustrated may be understood by cross reference to FIG. 2A and other figures.

Figure 2L:
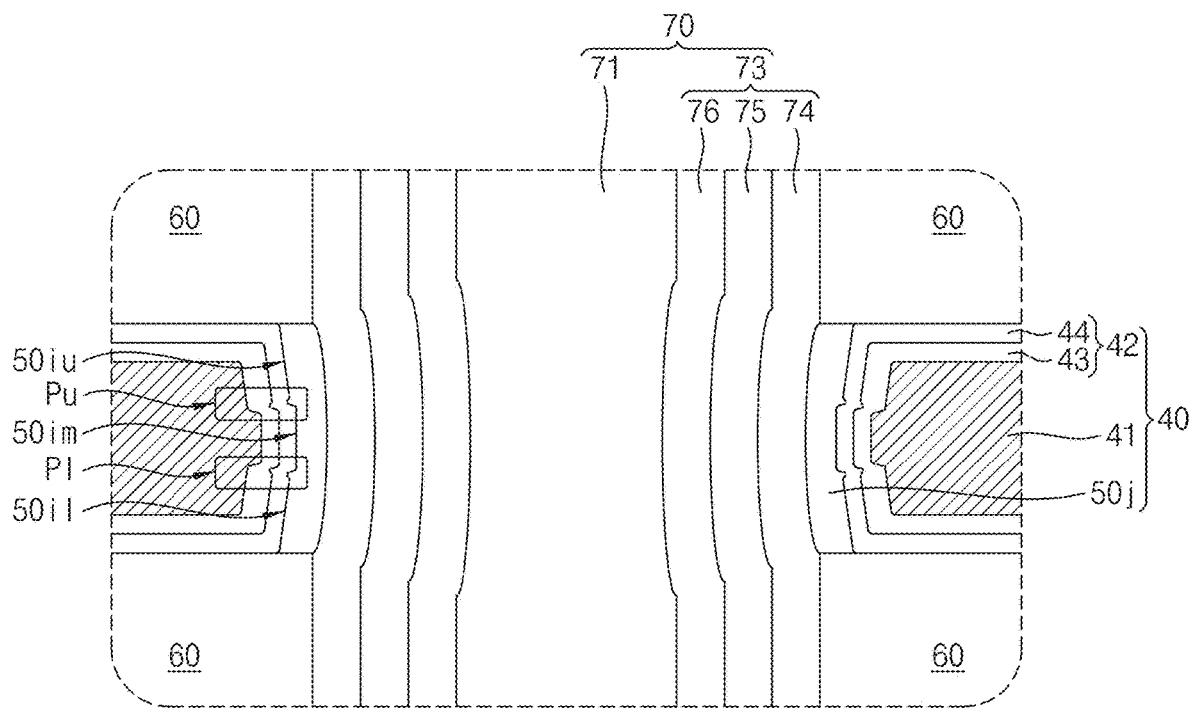

Referring to FIG. 2L, the inner side surface of the blocking barrier pattern 50*j* in accordance with an embodiment may include portions Pu and Pl protruding toward the cell gate electrode 41 or the cell gate barrier pattern 42. For example, the blocking barrier pattern 50*j* may have a first protruding portion Pu slightly protruding toward a portion between the upper inner side surface 50*iu*, and the middle inner side surface 50*im*, and a second protruding portion Pl slightly protruding toward a portion between the lower inner side surface 50*il* and the middle inner side surface 50*im*. The protruding portions (Pu and Pl) may be very fine. The upper inner side surface 50*iu* and the lower inner side surface 50*il* may be inclined. The interface between the inner cell gate barrier pattern 43 and the outer cell gate barrier pattern 44 of the cell gate barrier pattern 42 may also have the protruding portions Pu and Pl along the profile of the inner side surface of the blocking barrier pattern 50*j*. The interface between the cell gate electrode 41 and the cell gate barrier pattern 42 may also have protruding portions Pu and Pl. In an embodiment, the interface between the cell gate electrode 41 and the cell gate barrier pattern 42 may have a substantially a staircase profile.

Figure 2M:
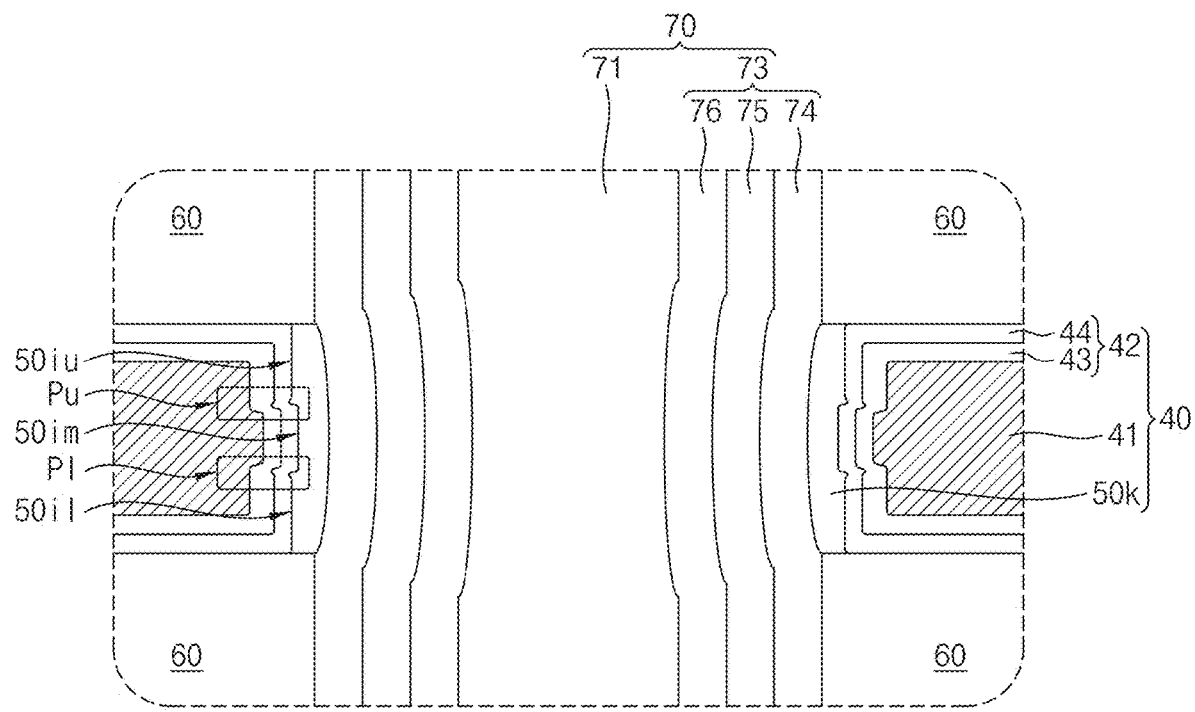

Referring to FIG. 2M, the inner side surface of the blocking barrier pattern 50*k* in accordance with an embodiment may have protruding portions Pu and Pl protruding toward the cell gate electrode 41 or the cell gate barrier pattern 42, and may include a vertically flat upper inner side surface 50*iu*, a middle inner side surface 50*im*, and a lower inner side surface 50*il*.

Figure 2N:
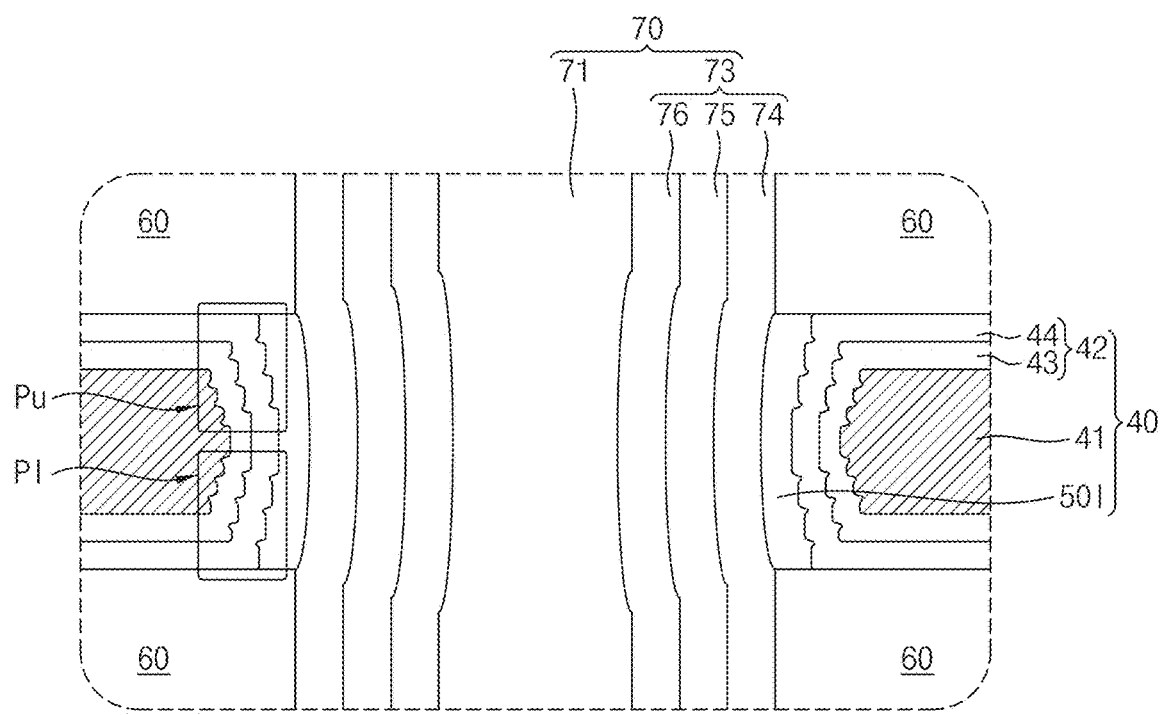

Referring to FIG. 2N, the inner side surface of the blocking barrier pattern 50*i* in accordance with an embodiment may have a plurality of protruding portions Pu and Pl. The interface between the inner cell gate barrier pattern 43 and the outer cell gate barrier pattern 44 of the cell gate barrier pattern 42 may also have the plurality of protruding portions Pu and Pl along the profile of the inner side surface of the blocking barrier pattern 50*j*. The interface between the cell gate electrode 41 and the cell gate barrier pattern 42 may also have a plurality of protruding portions Pu and Pl. In an embodiment, the interface between the cell gate electrode 41 and the cell gate barrier pattern 42 may have a substantially staircase profile.

According to the protrusions Pu and Pl of the inner side surfaces of the blocking barrier patterns 50*j*, 50*k*, and 50*l* in accordance with the embodiments shown in FIGS. 2I to 2N may be formed toward the cell gate electrode 41, a sharp portion between the cell gate electrode 41 and the vertical channel structure 70 cannot be formed and thus the electric field concentration effect between the cell gate electrode 41 and the vertical channel structure 70 does not occur.

Figure 3A:
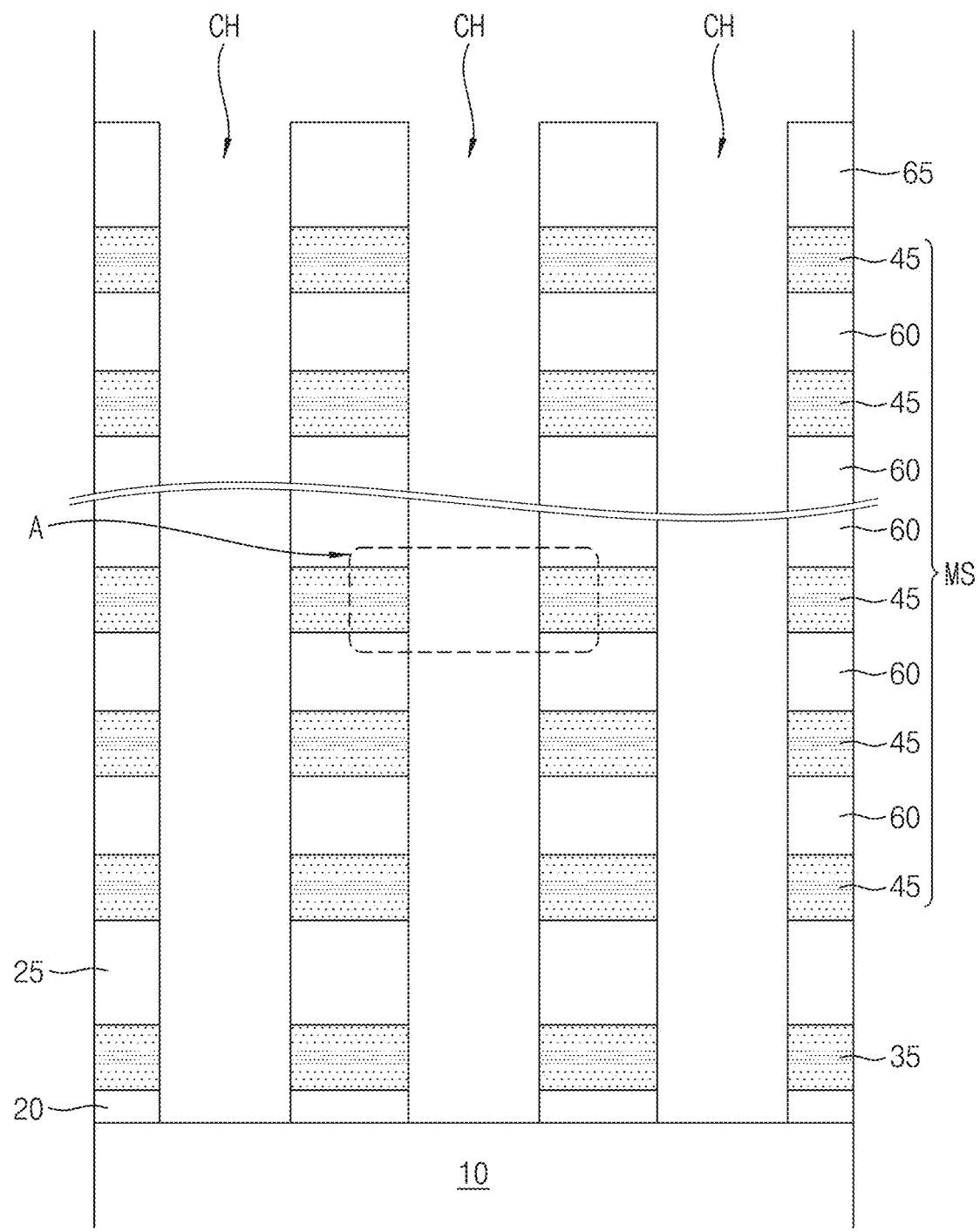
Figure 3B:
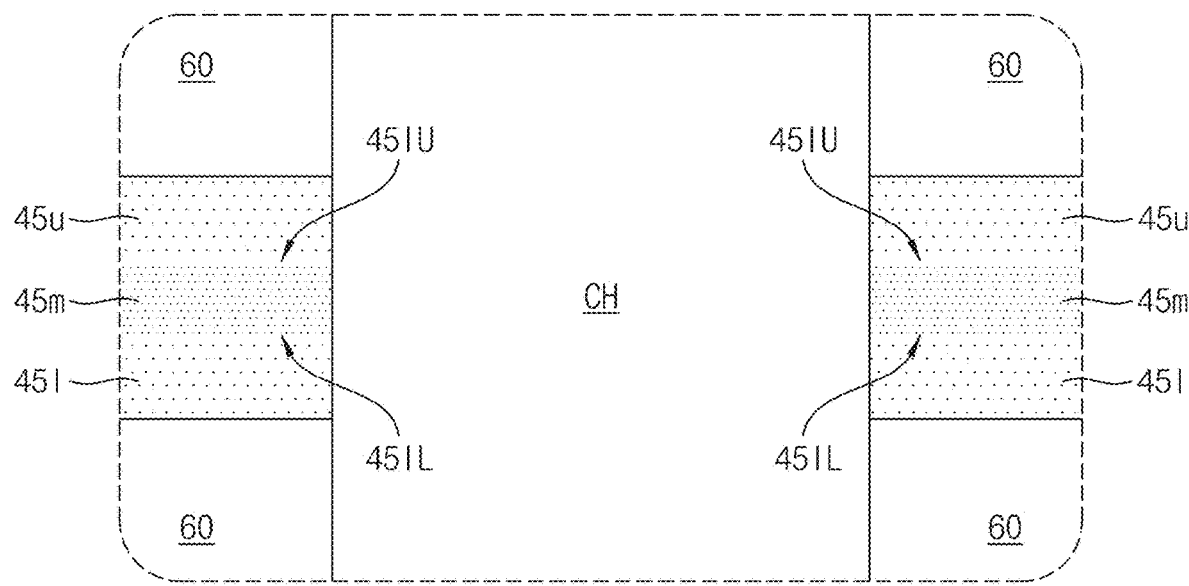

FIGS. 3A and 3B to FIG. 6 are longitudinal cross-sectional views illustrating a method of forming a three-dimensional flash memory device in accordance with an embodiment. FIGS. 3A, 4A, 5A, and 6 are longitudinal sectional views, and FIGS. 3B, 4B, and 5B are enlarged views of the area "A".

Referring to FIGS. 3A and 3B, a method of forming a three-dimensional flash memory device in accordance with an embodiment may include performing a plurality of deposition processes to form a surface insulating layer 20, a lower sacrificial insulating layer 35, a lower interlayer insulating layer 25, a mold stack layer MS, and a capping insulating layer 65 on a substrate 10, and performing a photolithography and etch process to form a channel hole CH. For example, the method may include performing an oxidation process or a deposition process to form the surface insulating layer 20 on the substrate 10. For example, the substrate may include monocrystalline silicon. The lower sacrificial insulating layer 35 may include a material different from the surface insulating layer 20 to have an etch selectivity with the surface insulating layer 20. For example, the lower sacrificial insulating layer 35 may include silicon nitride. The lower interlayer insulating layer 25 may include a material different from the lower sacrificial insulating layer 35 to have an etch selectivity with the lower sacrificial insulating layer 35. For example, the lower interlayer insulating layer 25 may include silicon oxide. The mold stack layer MS may include a plurality of sacrificial insulating layers 45 and a plurality of mold insulating layers 60 alternately stacked on the lower interlayer insulating layer 25. For example, the sacrificial insulating layers 45 may include silicon nitride, and the mold insulating layers 60 may include silicon oxide. Accordingly, the sacrificial insulating layers 45 and the mold insulating layers 60 can have an excellent etch selectivity. The capping insulating layer 65 may be formed relatively thicker than the mold insulating layers 60 on the mold stack layer MS. The capping insulating layer 65 may include the same material as the mold insulating layer 60 such as silicon oxide. The channel hole CH may pass through the capping insulating layer 65, the mold stack layer MS, the lower interlayer insulating layer 25, the lower sacrificial insulating layer 35, and the surface insulating layer 20 to expose a portion of the substrate 10 The channel hole CH may be circular shape in a top view. Each of the sacrificial insulating layers 45 of the mold stack layer MS may include silicon nitride ($Si_xN_y$) and may have various concentration distributions. (Where x and y are positive real numbers). For example, each sacrificial insulating layer 45 may have a Si-rich lower layer 45*l*, an N-rich middle layer 45*m*, and a Si-rich upper layer 45*u*.

The Si-rich lower layer 451 and the Si-rich upper layer 45u may have a relatively low nitrogen (N) concentration, i.e., a relatively high silicon (Si) concentration, than the N-rich middle layer 45m. Therefore, the N-rich middle layer 45m may have a relatively high nitrogen (N) concentration, that is, a relatively low silicon (Si) concentration, than the Si-rich lower layer 451 and the Si-rich upper layer 45u. In an embodiment, the lower boundary 45il between the lower layer 451 and the middle layer 45m and/or the upper boundary 45iu between the middle layer 45m and the upper layer 45u may not be visible. For example, when the concentration profile of the Si-rich lower layer 451, the middle layer 45m, and the upper layer 45u gradually changes, the lower interface 45il and the upper interface 45iu may not substantially exist. In an embodiment, when a concentration profile of the Si-rich lower layer 451, the middle layer 45m, and the upper layer 45u is changed staircase or discrete, the lower boundary 45il and the upper boundary 45iu may substantially be exist. The sacrificial insulating layer 45 can be formed by repeatedly performing a plurality of deposition processes. For example, the Si-rich lower layer 451 can be formed by a first deposition process in which the N-source is relatively poor, and the N-rich middle layer 45m may be formed by a second deposition process in which the N-source is relatively rich, and the Si-rich upper layer 45u can be formed by a third deposition process in which the N-source is relatively poor. In an embodiment, during the process of forming the sacrificial insulating layer 45, the Si-rich lower layer 451, the N-rich middle layer 45m, and the Si-rich upper layer 45u may successively be formed according to the N-source supply amount gradual change.

Figure 4A:
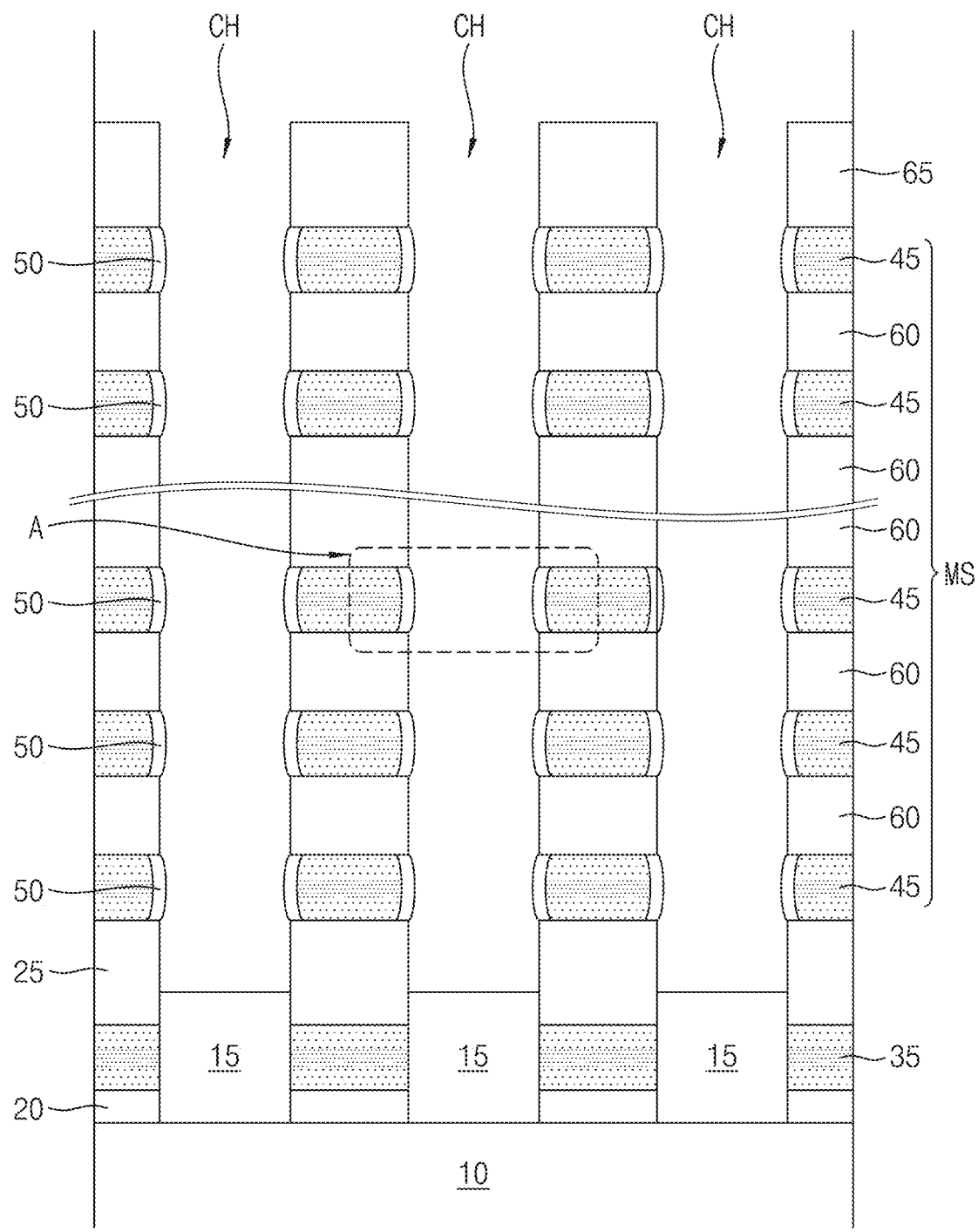
Figure 4B:
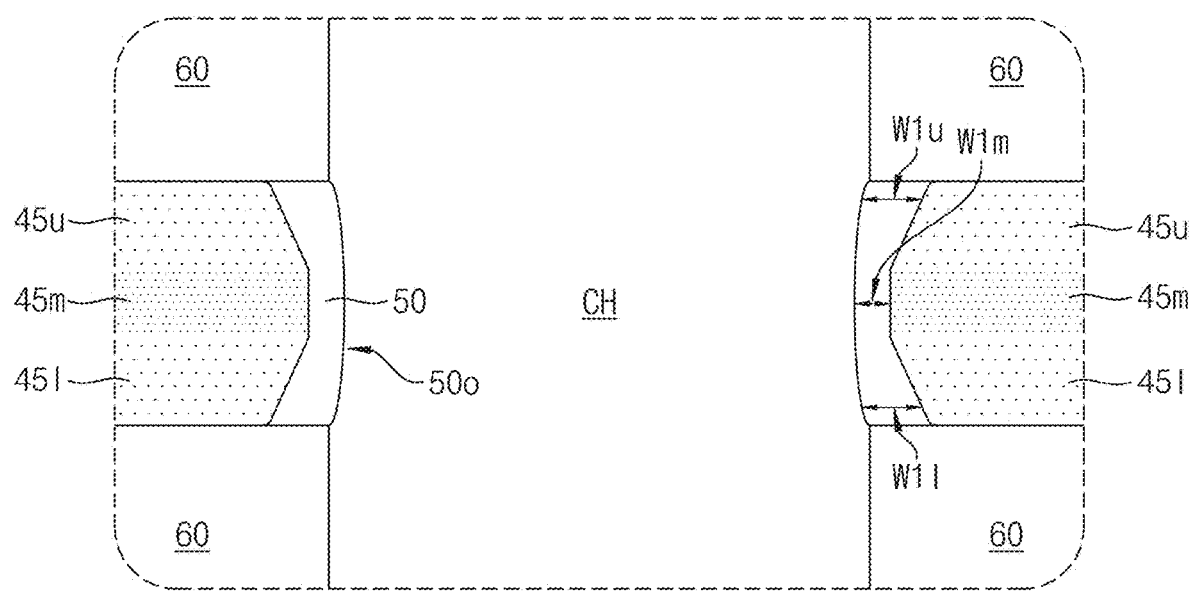

Referring to FIGS. 4A and 4B, the method may include forming the elevated source region 15 and forming the blocking barrier pattern 50. Forming the elevated source region 15 may include performing an epitaxial growth process to form an epitaxially grown layer on the substrate 10 exposed in the channel hole CH. Thus, the elevated source region 15 may include an epitaxial layer including a monocrystalline silicon layer, a silicon-germanium (SiGe) layer, a silicon-carbon (SiC) layer, or other monocrystalline silicon. The top level of the elevated source region 15 may be located at a higher level than the top surface of the lower sacrificial insulating layer 35. Therefore, the elevated source region 15 and the lower sacrificial insulating layer 35 may be in contact with each other. Forming the blocking barrier pattern 50 may include oxidizing a portion of the sacrificial insulating layers 45 of the mold stack layer MS exposed in the channel hole CH. An in-situ steam generation (ISSG) oxidation process or a plasma oxidation process may be performed to partially oxidize the sacrificial insulating layers 45. In the oxidation process, the oxygen radical may penetrate into the sacrificial insulating layer 45 to directly bond with the dangling bonds of the silicon atoms, and may be substituted with the nitrogen atoms that are bonded to the silicon. For example, since the Si-rich lower layer 451 and the Si-rich upper layer 45u are relatively silicon-rich layers, the ratio of the oxygen radical directly bonding with the dangling bonds of the silicon atoms can be relatively higher than that in the N-rich middle layer 45m, and since the N-rich middle layer 45m is relatively nitrogen-rich layers, the ratio of the oxygen radicals substituted with nitrogen atoms can be relatively higher than that in the Si-rich lower layer 451 and the Si-rich upper layer 45u. Therefore, during the oxidation process, the lower horizontal width W1l of the blocking barrier pattern 50 formed by oxidizing the Si-rich lower layer 451 may become thicker toward the bottom, and the upper horizontal width W1u of the blocking barrier pattern 50 formed by oxidizing the Si-rich upper layer 45u may become thicker toward the top. In the N-rich middle layer 45m, the oxygen atoms and the nitrogen atoms are substituted, as the nitrogen atoms can be discharged from the sacrificial insulating layer 45 to the outside, the N-rich middle layer can expand relatively less. In addition, oxygen atoms can penetrate relatively deeper through the interface between the sacrificial insulating layer 45 and the mold insulating layer 60. Therefore, the closer the Si-rich lower layer 451 and the Si-rich upper layer 45u to the mold insulating layer 60, the more oxidizable, and the horizontal widths W1u and W1l can increase. The outer side surface 50o of the blocking barrier pattern 50 may protrude toward the channel hole CH. For example, the outer side surface 50o of the blocking barrier pattern 50 may be rounded.

Figure 5A:
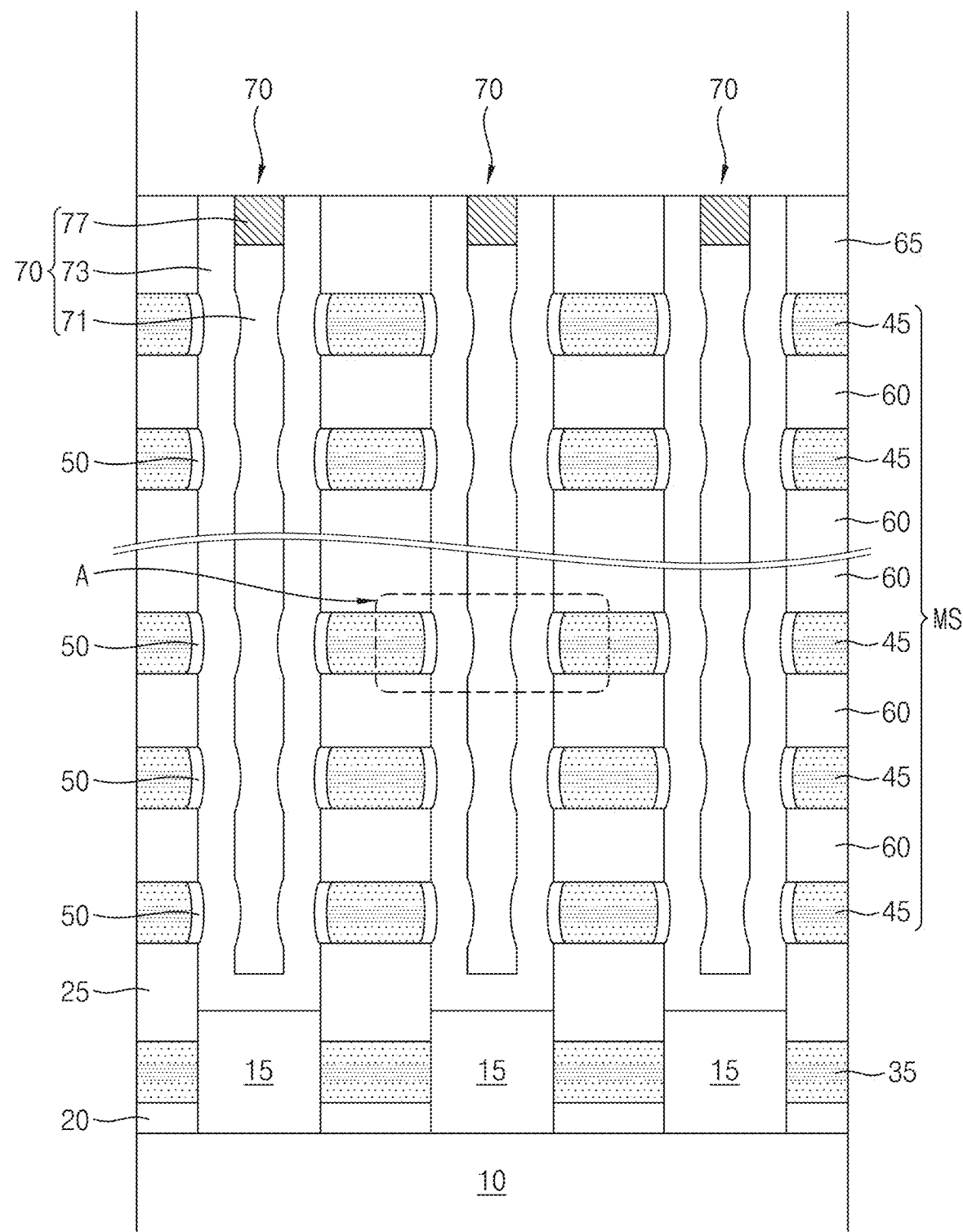

Referring to FIGS. 5A and 5B, the method may include forming a vertical channel structure 70 in the channel hole CH. Forming the vertical channel structure 70 may include performing an atomic layer deposition process to conformably form a channel pattern 73 on an inner wall and a bottom of the channel hole CH, and performing a gap-fill process to form a gap-fill pattern 71 in the channel hole CH, and forming a via pad 77 on the gap-fill pattern 71 by performing an etching, a deposition, and a chemical mechanical polishing (CMP) process. The channel pattern 73 may include a charge trap layer 74, a tunneling insulating layer 75, and a channel layer 76. The charge trap layer 74 may be conformably formed on the mold insulating layer 60 and the blocking barrier pattern 50. The charge trap layer 74 may have a conformal profile along the side surfaces of the mold insulating layer 60 and the outer side surface 50o of the blocking barrier pattern 50. For example, the interface between the charge trap layer 74 and the mold insulating layer 60 may be substantially vertically flat, and the interface between the charge trap layer 74 and the blocking barrier pattern 50 may be rounded. The charge trap layer 74 may have a rounded side surface 74R corresponding to the outer side surface 50o of the blocking barrier pattern 50. The charge trap layer 74 may include a relatively high-k dielectric material such as silicon nitride. The tunneling insulating layer 75 may be conformably formed on the charge trap layer 74. The tunneling insulating layer 75 may have a rounded side surface 75R corresponding to the rounded side surface 74R of the charge trap layer 74. The tunneling insulating layer 75 may include a relatively easier tunneling and durable insulating material such as silicon oxide. The channel layer 76 may be conformably formed on the tunneling insulating layer 75. The channel layer 76 may have a rounded side surface 76R corresponding to the rounded side surface 75R of the tunneling insulating layer 75. The gap-fill pattern 71 may be formed on the channel layer 76 to fill the channel hole CH. The gap-fill pattern 71 may include a material having excellent filling properties such as silicon oxide. The via pad 77 may be directly and electrically connected to the channel layer 76. The via pad 77 may include at least one of an N-doped polysilicon, a metal silicide, a metal compound, or a metal.

Figure 6:
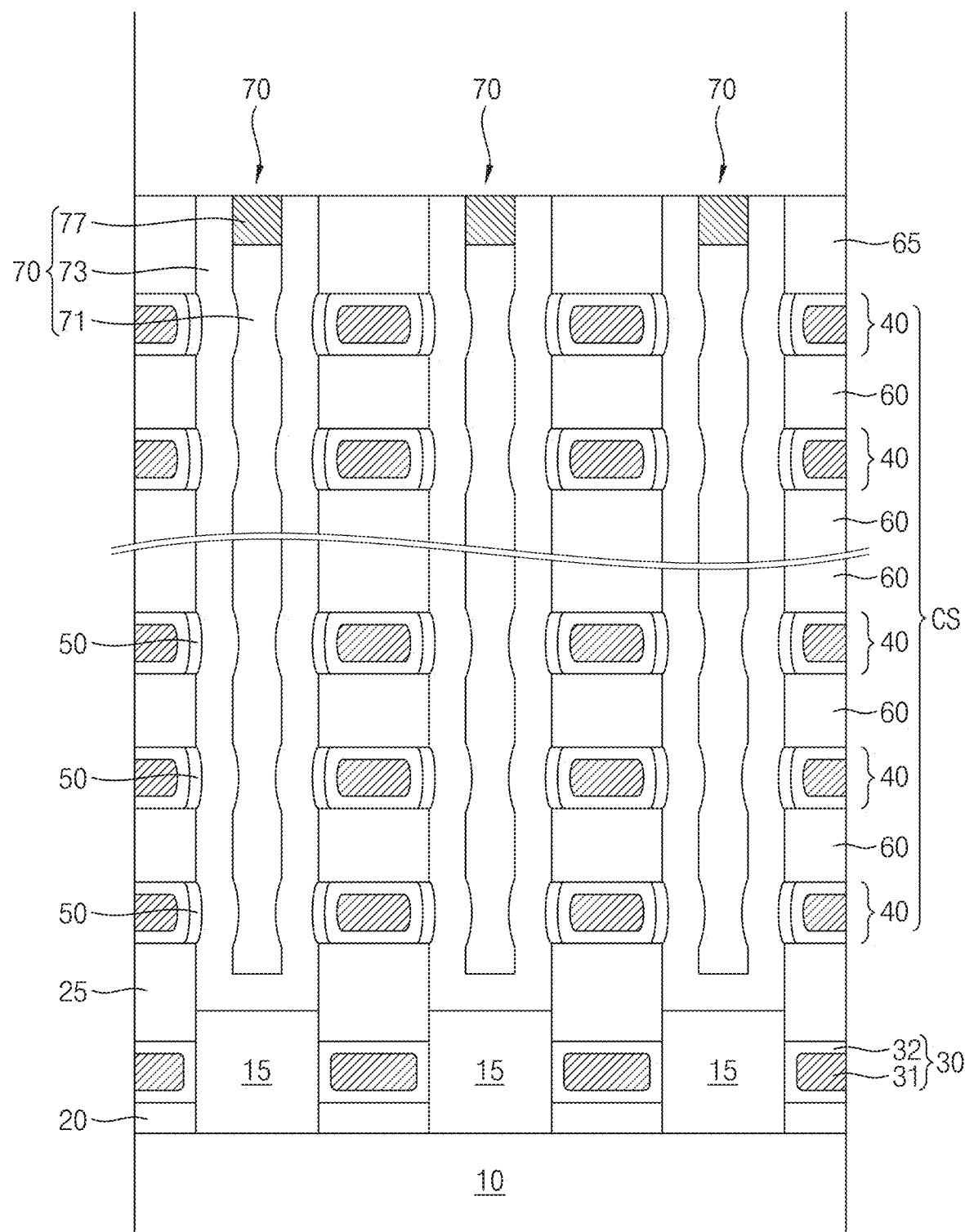

Referring to FIGS. 6 and 2B, the method may include removing the sacrificial insulating layer 45 and forming the cell gate pattern 40 in the empty space defined by the removal of the sacrificial insulating layer 45. The sacrificial insulating layer 45 can be removed using a wet etchant such as phosphoric acid ($H_3PO_4$). The cell gate pattern 40 may include a cell gate electrode 41 and a cell gate barrier pattern 42 formed by performing an atomic layer deposition process. The cell gate barrier pattern 42 may include an inner cell gate barrier pattern 43 and an outer cell gate barrier pattern 44. The cell gate pattern 40 has been described in detail with reference to FIG. 2B.

Depending on the process conditions, as shown in FIGS. 2A to 2K, elements shapes of the same as or similar to the various cell gate electrodes 41, the cell gate barrier pattern 42, the blocking insulating layers 50-50h, and the vertical channel structure 70 can be formed.

Figure 7A:
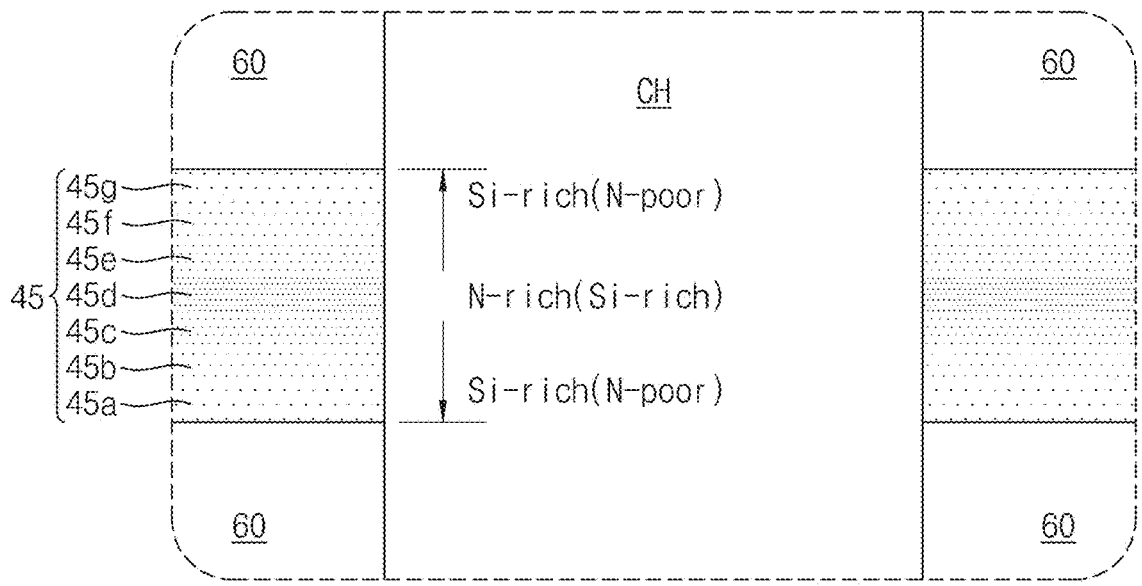
Figure 7B:
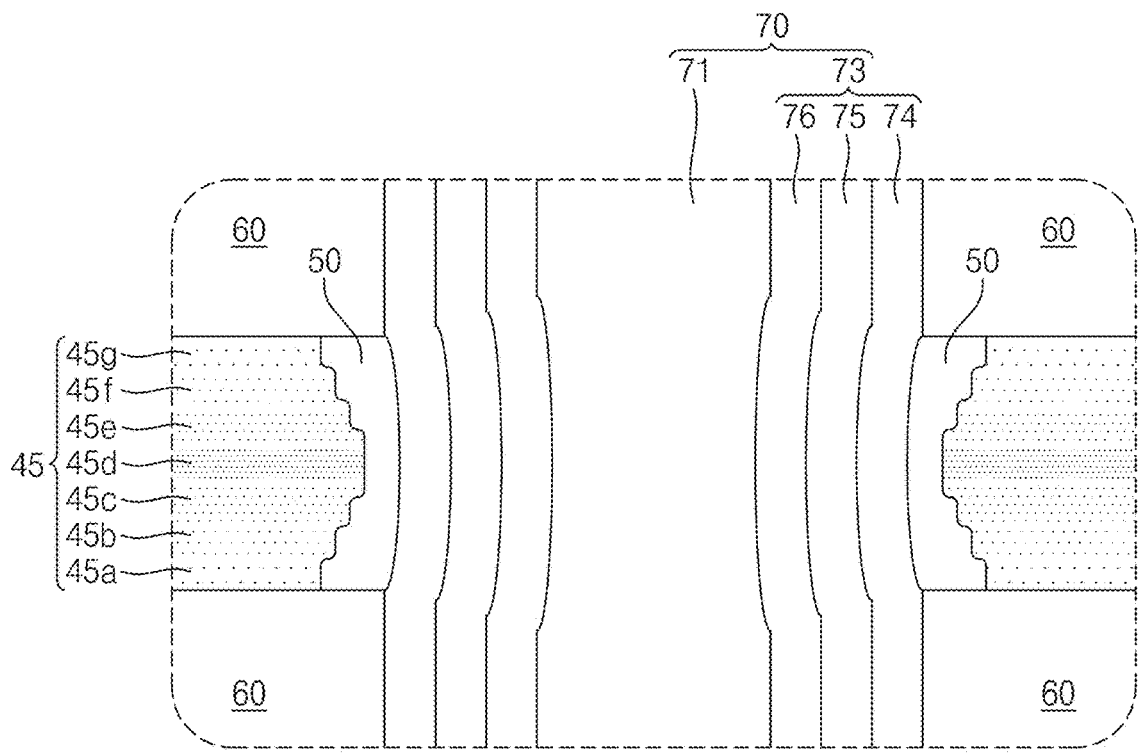

FIGS. 7A and 7B are longitudinal cross-sectional views illustrating a method of forming a three-dimensional flash memory device in accordance with an embodiment. At first, referring to FIGS. 3A and 7A, the sacrificial insulating layer 45 may include unit sacrificial insulating layers 45a to 45g having various N-concentrations. The unit sacrificial insulating layers 45a to 45g may include the unit sacrificial insulating layers 45a to 45c in which N-concentration is lowered downward from the central layer 45d having the most N-concentration and the unit sacrificing insulating layers 45e to 45g in which N-concentration is lowered upward from the central layer 45d. Although the drawings show that the sacrificial insulating layer 45 includes seven layers of unit sacrificial insulating layers 45a to 45g, in an embodiment, the sacrificial insulating layer 45 can include more unit sacrificial layers 45a to 45g. Referring to FIGS. 4A and 7B, the method may include performing an oxidation process to form the blocking barrier pattern 50. Further referring to FIG. 2G, the interface of the blocking barrier pattern 50 and the unit sacrificial insulating layers 45a to 45g may have a staircase profile depending on the N-concentration. The outer side surface of the blocking barrier pattern 50 may be rounded. In an embodiment, the interface of the blocking barrier pattern 50 and the unit sacrificial insulating layers 45a to 45g may be substantially rounded. In an embodiment, the outer side surface of the blocking barrier pattern 50 may also have staircase profiles. Thereafter, the method may include performing the processes described with reference to FIGS. 5A and 6 to form the elements having the same as or similar to various cell gate electrodes 41, the cell gate barrier pattern 42, the blocking insulating layers 50 to 50i, and vertical channel structure 70 shown in FIGS. 2A to 2K.

Figure 8:
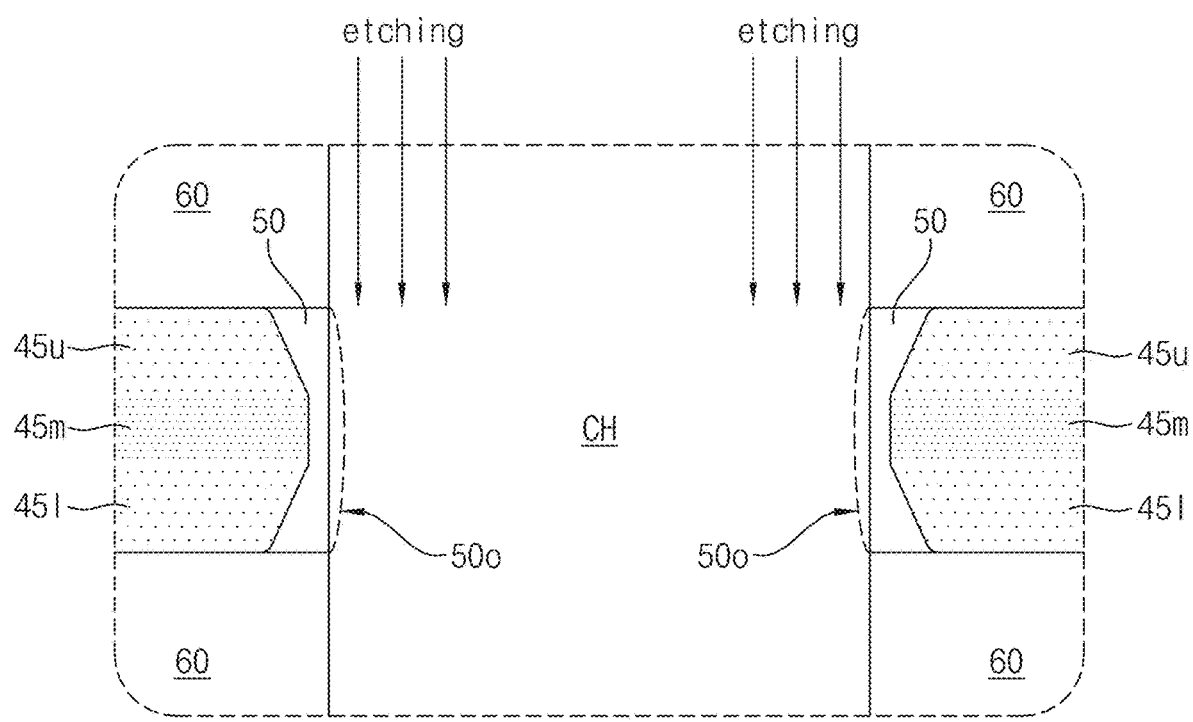

FIG. 8 is a vertical cross-sectional view illustrating a method of forming a three-dimensional flash memory device in accordance with an embodiment.

Referring to FIG. 8, after forming the blocking barrier pattern 50 and the channel hole CH by performing the processes described with reference to FIGS. 3A and 3B to FIGS. 4A and 4B, the method may further include performing a partial etching process to partially remove the outer side portions of the blocking barrier pattern 50 protruding toward the channel CH. During the process, the outer side surface of the blocking barrier pattern 50 can be substantially vertically flat.

The three-dimensional flash memory device in accordance with an embodiment of the disclosure may include a cell gate electrode having a rounded side surface. The three-dimensional flash memory device in accordance with an embodiment of the disclosure may include a cell gate barrier pattern and a blocking barrier pattern having a concavely rounded inner side surface and a convexly rounded outer side surface. The three dimensional flash memory devices in accordance with an embodiment of the disclosure may include a channel pattern having a concavely rounded outer side surface. Accordingly, in the three-dimensional flash memory device in accordance with the embodiments, the electric field is not concentrated between the cell gate electrode and the channel pattern and can be widely dispersed. In the channel pattern, the tunneling of charges or electrons is widely dispersed without being concentrated in a part, so that the physical and electrical reliability of the channel pattern and the effective lifetime of the device can be improved.

While the example embodiments of the disclosure have been described with reference to the accompanying drawings, those skilled in the art to which the disclosure pertains can understand that the disclosure may be implemented in other specific forms without departing from the technical spirit or the necessary features of the disclosure. Therefore, it should be understood that the above-described example embodiments are not limitative but illustrative in all aspects.

What is claimed is:

1. A three-dimensional flash memory device comprising:
a substrate;
a plurality of cell gate patterns and a plurality of mold insulating layers alternately stacked on the substrate; and
a vertical channel structure in contact with side surfaces of the plurality of cell gate patterns and side surfaces of the plurality of mold insulating layers, wherein:
each of the plurality of cell gate patterns includes a cell gate electrode and a blocking barrier pattern adjacently disposed on one aide surface of the cell gate electrode,
the vertical channel structure includes a central gap-fill pattern, and a channel pattern surrounding the gap-fill pattern,
the channel pattern includes a channel layer formed to surround the side surfaces of the gap-fill pattern, a tunneling insulating layer formed to surround the outer side surfaces of the channel layer, and a charge tray formed to surround the outer side surfaces of the tunneling insulating layer and formed on the outer side surface of the blocking barrier pattern, and
the blocking barrier pattern is between the channel pattern and the cell gate patterns, and has a portion protruding convexly toward the channel pattern and side surfaces contact directly with the mold insulating layers.

2. The three-dimensional flash memory device of claim 1, wherein:
the blocking barrier pattern has an inner side including an upper inner side surface, a middle inner side surface, and a lower inner side surface,
the middle inner side surface is between the upper inner side surface and lower inner side, and faces the one side surface of the cell gate electrode,
the blocking barrier pattern has a portion protruding toward the cell gate electrode at a connection point between the upper inner side surface of the blocking barrier pattern and the middle inner side surface of the blocking barrier pattern,
the upper inner side surface of the blocking barrier pattern has a first slope,
the lower inner side surface of the blocking barrier pattern has a second slope different than the first slope, and
the first slope and the second slope have a symmetrical shape.

3. The three-dimensional flash memory device of claim 2, wherein, along the inner side surface of the blocking barrier pattern, the blocking barrier pattern has a staircase difference at the connection point between the upper inner side surface of the blocking barrier pattern and the middle inner side surface of the blocking barrier pattern.

4. The three-dimensional flash memory device of claim 2, wherein the middle inner side surface of the blocking barrier pattern is vertically flat.

5. The three-dimensional flash memory device of claim 2, wherein the inner side surface of the blocking barrier pattern has a concave surface and an outer sidewall of the blocking barrier pattern has a convexly rounded surface.

6. The three-dimensional flash memory device of claim 2, wherein an average horizontal width between the upper inner side surface and an outer side surface of the blocking barrier pattern is greater than an average horizontal width between the middle inner side surface and the outer side surface of the blocking barrier pattern.

7. The three-dimensional flash memory device of claim 1, wherein the one side surface of the cell gate electrode is convexly rounded.

8. A three-dimensional flash memory device comprising:
a substrate;
a cell gate pattern and a mold insulating layer stacked on the substrate,
the mold insulating layer including an insulating material,
the cell gate pattern including a cell gate electrode, a conductive inner cell gate barrier pattern, an insulating outer cell gate barrier pattern, and a blocking barrier pattern,
the conductive inner cell gate barrier pattern surrounding an upper surface of the cell gate electrode, a lower surface of the cell gate electrode, and a side surface of the cell gate electrode,
a first surface of the insulating outer cell gate barrier pattern conformably covering the conductive inner cell gate barrier pattern,
an inner side surface of the blocking barrier pattern being on a second surface of the insulating outer cell gate barrier pattern that is opposite the first surface of the insulating outer cell gate barrier pattern,
the inner side surface of the blocking barrier pattern having a concavo-convex shape including a recessed portion, and
an outer side surface of the blocking barrier pattern having a convexly projecting outer side surface; and
a vertical channel structure abutting side surfaces of the cell gate pattern and the mold insulating layer.

9. The three-dimensional flash memory device of claim 8, wherein
the inner side surface of the blocking barrier pattern includes an upper inner side surface having a downward slope, a middle inner side surface having a vertical slope, and a lower inner side surface having an upward slope,
the upper inner side surface of the blocking barrier pattern and the lower inner side surface of the blocking barrier pattern have a concavo-convex shape, and
the middle inner side surface of the blocking barrier pattern is flat.

10. The three-dimensional flash memory device of claim 8, wherein
the first surface of the insulating outer cell gate barrier pattern has a portion that is concavely recessed toward the cell gate electrode, and
the second surface of the insulating outer cell gate barrier pattern protrudes convexly toward the blocking barrier pattern.

11. A three-dimensional flash memory device comprising:
a substrate;
a plurality of cell gate patterns and a plurality of mold insulating layers alternately stacked on the substrate,
the plurality of mold insulating layers including an insulating material,
each of the plurality of cell gate patterns including a blocking barrier pattern and a cell gate electrode surrounding one side surface of the blocking barrier pattern,
an inner side surface of the blocking barrier pattern including an upper inner side surface, a middle inner side surface, and a lower inner side surface,
the upper inner side surface and the lower inner side surface of the inner side surface of the blocking barrier pattern each having a concavo-convex shape; and
a vertical channel structure in contact with side surfaces of the plurality of cell gate patterns and the plurality of mold insulating layers.

12. The three-dimensional flash memory device of claim 11, wherein
an average horizontal width between the cell gate electrode and the upper inner side surface of the blocking barrier pattern is less than an average horizontal width between the cell gate electrode and the middle inner side surface of the blocking barrier pattern.

13. The three-dimensional flash memory device of claim 11, wherein
a portion of the inner side surface of the blocking barrier pattern is concavely rounded,
the outer side surface of the blocking barrier pattern is convexly rounded,
the vertical channel structure includes a gap-fill pattern, a channel layer surrounding the gap-fill pattern, a tunneling insulating layer surrounding the channel layer, and a charge trap layer surrounding the tunneling insulating layer,
the charge trap layer directly contacts the outer sidewall of the blocking barrier pattern, and
the charge trap layer is spaced apart from the insulating outer cell gate barrier pattern.

14. The three-dimensional flash memory device of claim 2, wherein
an upper horizontal width on the upper inner side surface, and the lower horizontal width on the lower inner aide surface are thicker than the middle horizontal width of the middle inner side surface of the blocking barrier pattern.

15. The three-dimensional flash memory device of claim 2,
wherein the upper inner side surface of the blocking barrier pattern and the lower inner side surface of the blocking barrier pattern have a concavo-convex shape, respectively.

16. The three-dimensional flash memory device of claim 2, wherein:
each of the plurality of cell gate patterns includes an insulating outer cell gate barrier pattern between the cell gate electrode and the blocking barrier pattern,
a first surface of the insulating outer cell gate barrier pattern covers an upper segment of the one side surface of the cell gate electrode, a lower segment of the one side surface of the cell gate electrode, and a middle segment of the one side surface of the cell gate electrode, the first surface of the insulating outer cell gate barrier pattern has an upper inner side surface, a middle inner side surface, and a lower inner side surface corresponding to the upper inner side surface of the blocking barrier pattern, the middle inner side surface of the blocking barrier pattern, and the lower inner side surface of the blocking barrier pattern, respectively, and the insulating outer cell gate barrier pattern has a portion protruding toward the cell gate electrode at a connection point between the upper inner side surface and the middle inner side surface of the insulating outer cell gate barrier pattern.

17. The three-dimensional flash memory device of claim 2, wherein each of the plurality of cell gate patterns includes a conductive inner cell gate barrier pattern between the cell gate electrode and the blocking barrier pattern, the conductive inner cell gate barrier pattern covers an upper segment of the one side surface of the cell gate electrode, a lower segment of the one side surface of the cell gate electrode, and a middle segment of the one side surface of the cell gate electrode, an outer sidewall of the conductive inner cell gate barrier pattern faces the inner side surface of the blocking barrier pattern, the conductive inner cell gate barrier pattern has an upper outer side surface, a middle outer side surface, and a lower outer side surface corresponding to the upper inner side surface of the blocking barrier pattern, the middle inner side surface of the blocking barrier pattern, and the lower inner side surface of the blocking barrier pattern, respectively, and the conductive inner cell gate barrier pattern has a portion protruding toward the cell gate electrode at a connection point between the upper outer side surface of the conductive inner cell gate barrier pattern and the middle outer side surface of the conductive inner cell gate barrier pattern.

\* \* \* \* \*